United States Patent [19]
Lautzenhiser et al.

[11] Patent Number: 5,497,509
[45] Date of Patent: *Mar. 5, 1996

[54] FM-PM RECEIVERS WITH INCREASED SENSITIVITY

[75] Inventors: Lloyd L. Lautzenhiser, Nobel, Canada; Wendell E. Miller, Warsaw, Ind.

[73] Assignee: Emhiser Research Limited, Parry Sound, Canada

[*] Notice: The term of this patent shall not extend beyond the epiration date of Pat. No. 5,091,706.

[21] Appl. No.: 799,579

[22] Filed: Nov. 27, 1991

Related U.S. Application Data

[63] Continuation-in-part of Ser. No. 528,654, May 24, 1990, Pat. No. 5,091,706, and Ser. No. 598,530, Oct. 16, 1990, Pat. No. 5,097,230.

[51] Int. Cl.$^6$ .................................................. H04B 1/26
[52] U.S. Cl. ........................... 455/208; 455/260; 455/265; 332/128; 331/23
[58] Field of Search ..................... 455/208, 209, 455/260, 316, 314, 315, 318, 319, 113, 265; 329/325, 326; 331/1 A, 23, 25, 30; 332/128

[56] References Cited

U.S. PATENT DOCUMENTS

| | | |
|---|---|---|
| 3,346,814 | 10/1967 | Haggai . |
| 3,428,900 | 2/1969 | Newton . |
| 3,622,913 | 11/1971 | Shipley ...................................... 332/16 |
| 3,805,192 | 4/1974 | Ocnaschek et al. ...................... 332/9 R |
| 3,866,122 | 2/1975 | Baer et al. ................................ 455/44 |
| 4,198,604 | 4/1980 | Hocdaway ............................... 455/260 |
| 4,232,189 | 11/1980 | Leitch ...................................... 455/265 |
| 4,395,777 | 7/1983 | Oki et al. ............................... 455/183.2 |
| 4,408,351 | 10/1983 | Maurer et al. .......................... 455/265 |
| 4,409,563 | 10/1983 | Vande Graaf ............................ 331/11 |
| 4,516,083 | 5/1985 | Turney .................................... 331/1 A |
| 4,523,324 | 6/1985 | Marshall ................................. 455/208 |
| 4,523,328 | 6/1985 | Kasperkovitz ............................. 381/3 |
| 4,607,392 | 8/1986 | Nolde et al. ......................... 455/192.1 |
| 4,653,117 | 3/1987 | Heck ....................................... 455/209 |
| 4,696,056 | 9/1987 | Morita ..................................... 455/182 |
| 4,817,197 | 3/1989 | Shimizu et al. ........................ 455/208 |
| 4,837,853 | 6/1989 | Heck .................................... 455/209 X |
| 4,856,085 | 8/1989 | Horvat ..................................... 455/315 |
| 5,034,695 | 7/1991 | Owen ...................................... 329/325 |

*Primary Examiner*—Reinhard J. Eisenzopf
*Attorney, Agent, or Firm*—Wendell E. Miller

[57] ABSTRACT

Signal processing apparatus (410), for processing angularly modulated signals, provides improved sensitivity by reducing both the deviation of the modulation and the frequency of the bandwidth filter below the value calculated by Carson's rule. The signal processing apparatus (410) includes a closed loop (438) and a phase locking oscillator (270, 304, 318, 332, or 392) that is interposed into the closed loop (438). Both the frequency of the angularly modulated signal and the deviations of the angular modulation are reduced in the closed loop (438), and the demodulated output of the angularly modulated signal is produced in a conductor (436) of the closed loop (438). The phase locking oscillator (270, 304, 318, 332, or 392) includes both a forward path (204) and a feedback path (206), and an output frequency of the phase locking oscillator (270, 304, 318, 332, or 392) is phase locked to a reference frequency. The phase locked output frequency, in a conductor (230), is used as an input to the closed loop (438), and a derived signal, in the conductor (436) of the closed loop (438), which is the demodulated output of the angularly modulated signal, is used to vary the phase locked output frequency in the conductor (230). This varying of the phase locked output frequency includes separately modulating a frequency in the forward path (204) and a frequency in the feedback path (206) of the phase locking oscillator (270, 304, 318, 332, or 392). Modulation of frequencies in both paths (204 and 206) is accomplished without changing the reference frequency.

46 Claims, 13 Drawing Sheets

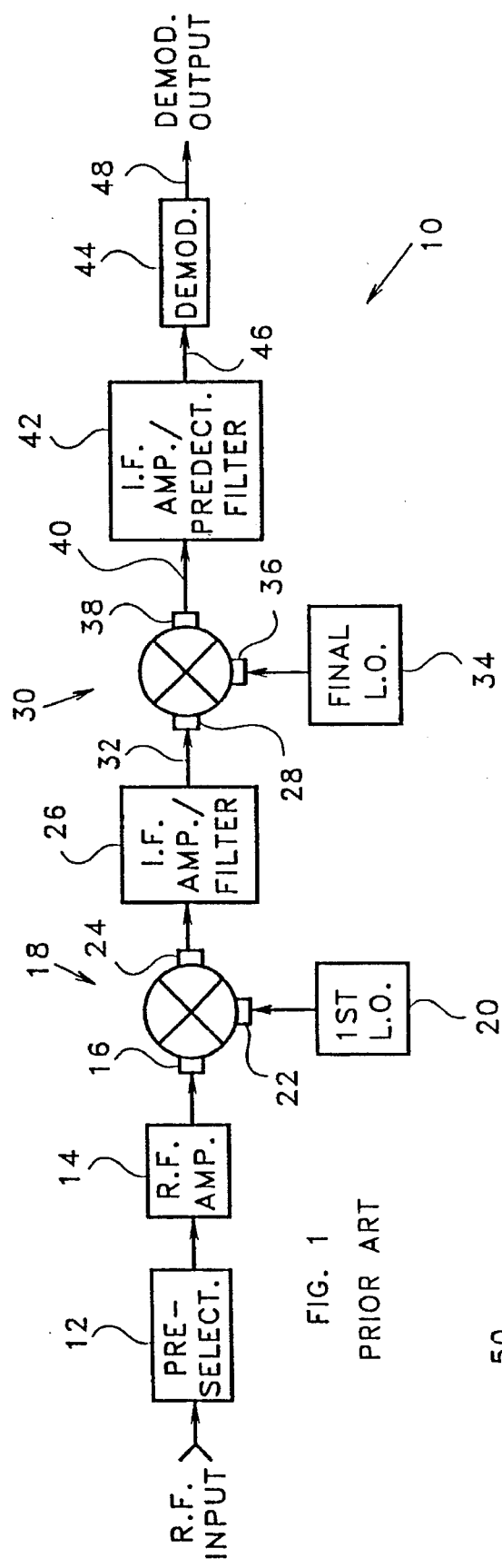
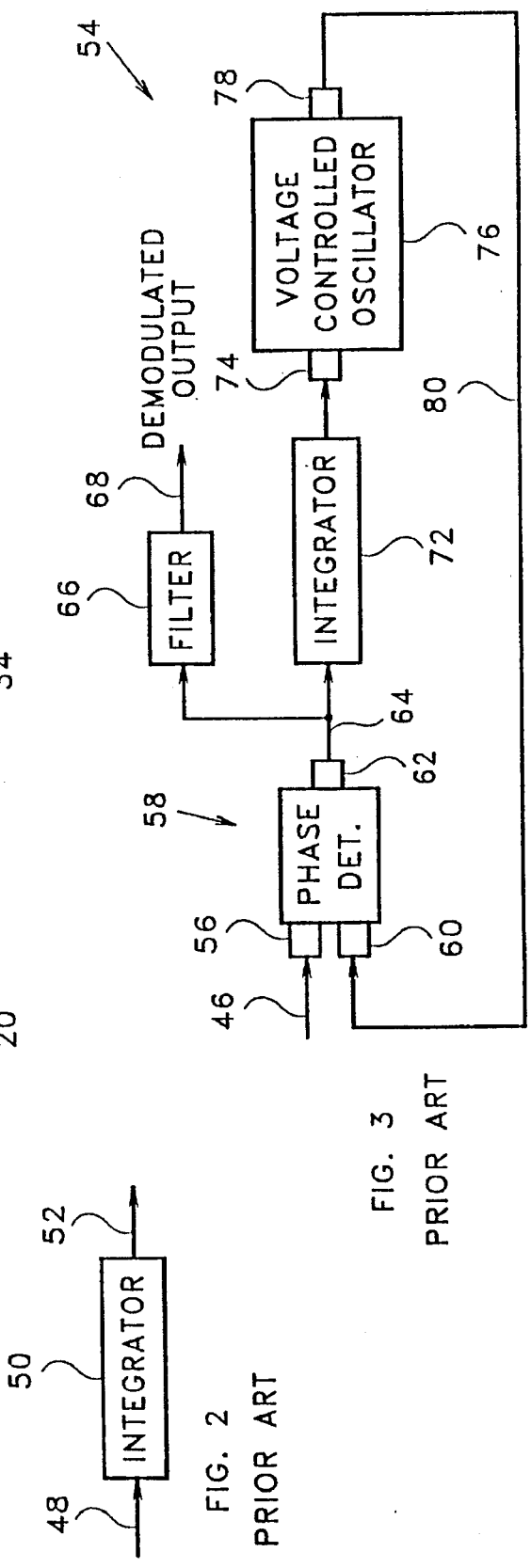
FIG. 1 PRIOR ART
FIG. 2 PRIOR ART
FIG. 3 PRIOR ART

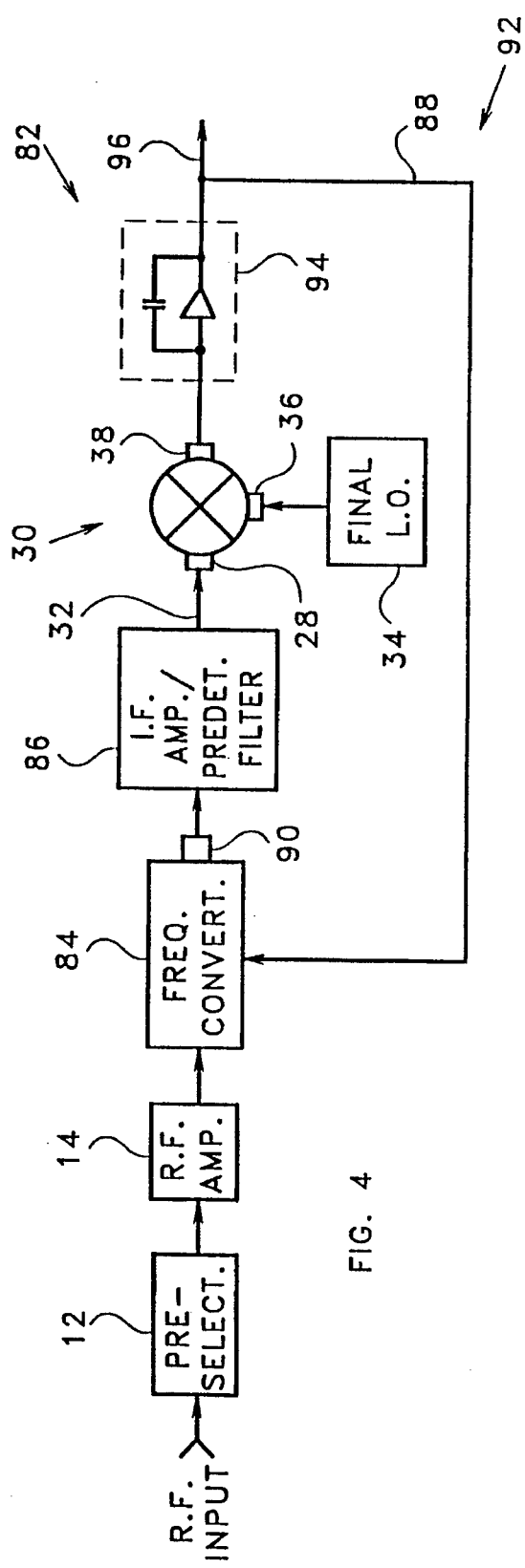
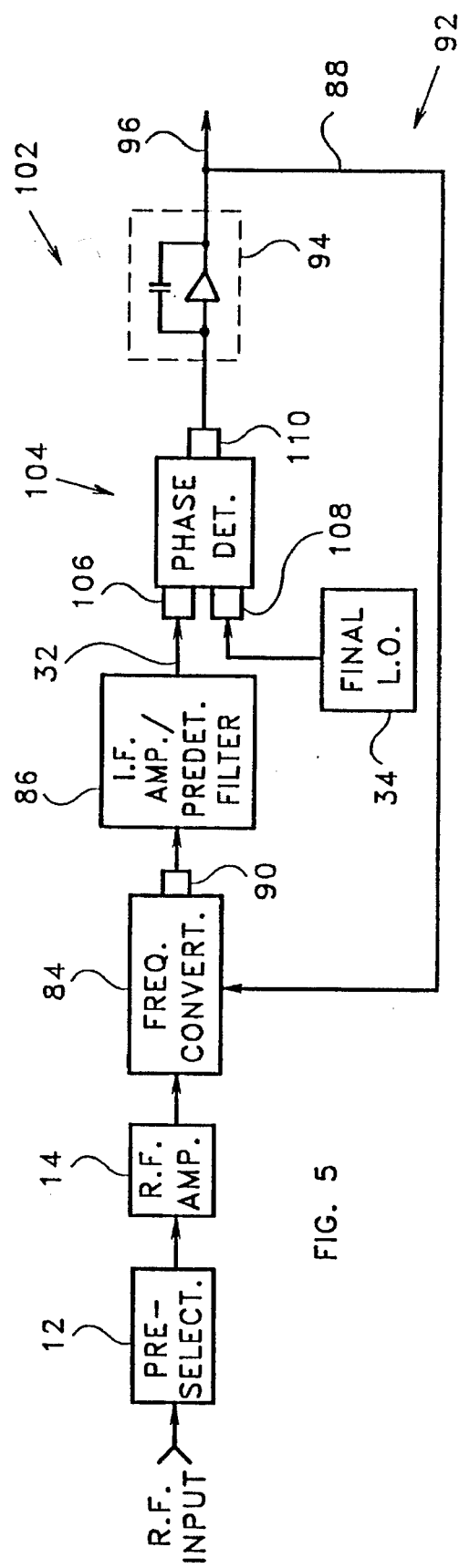

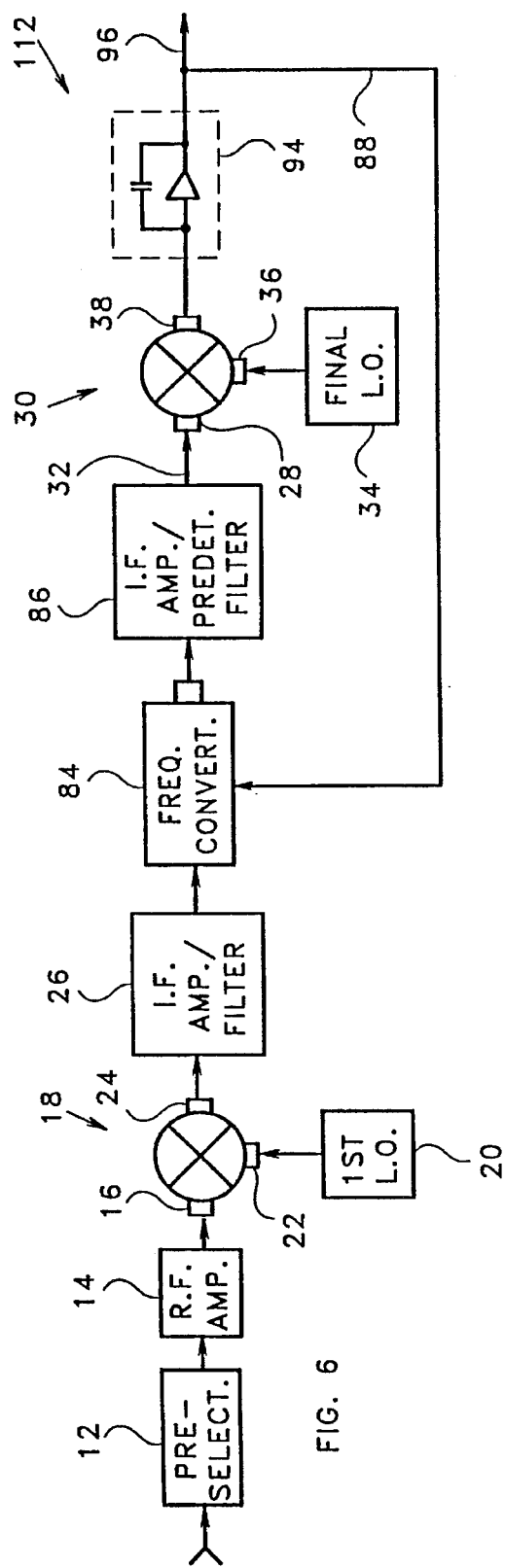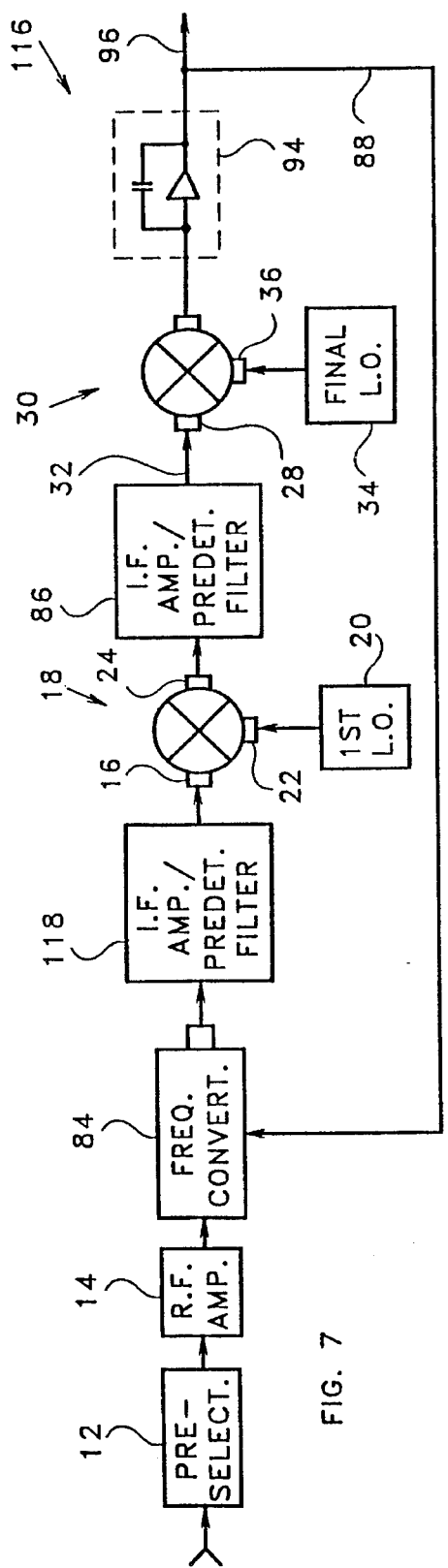

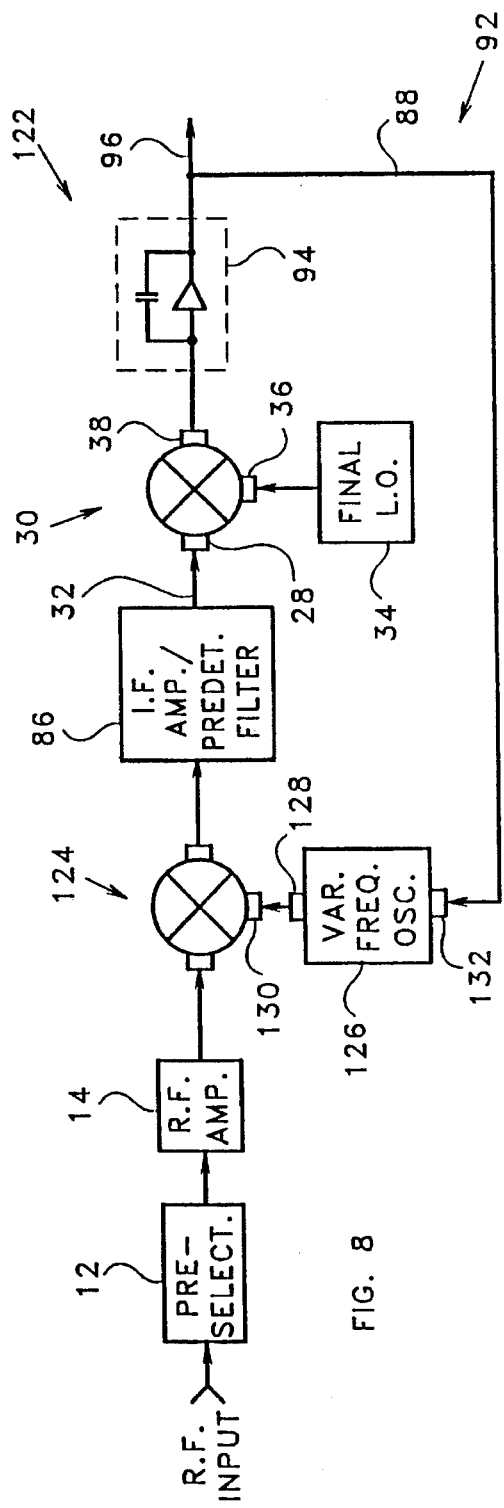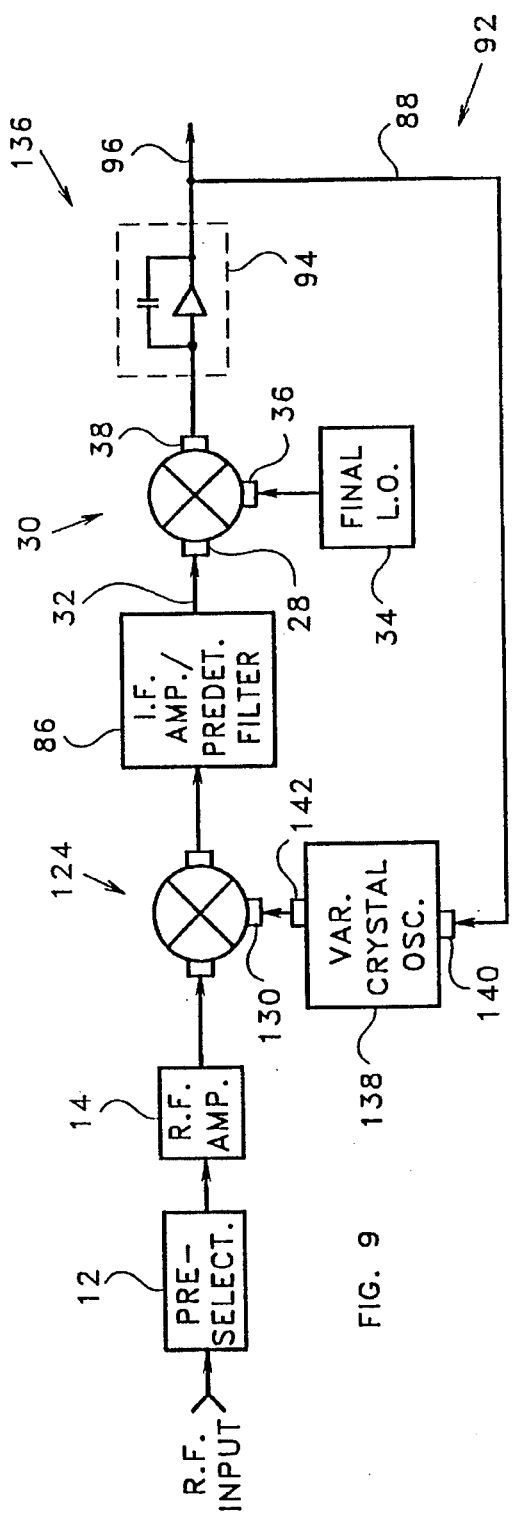

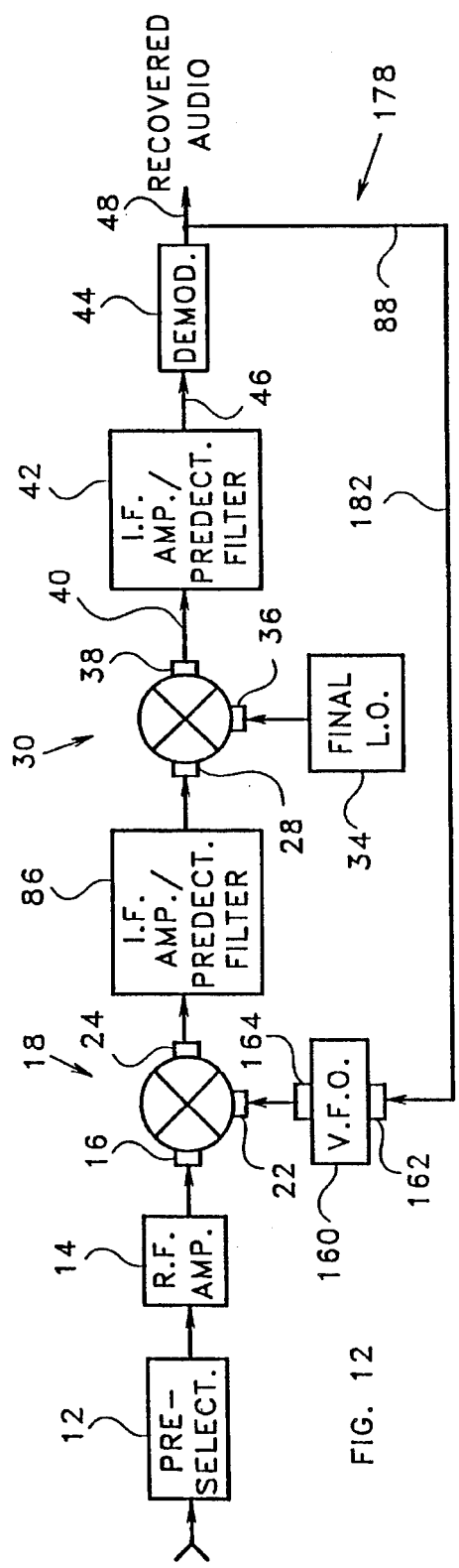
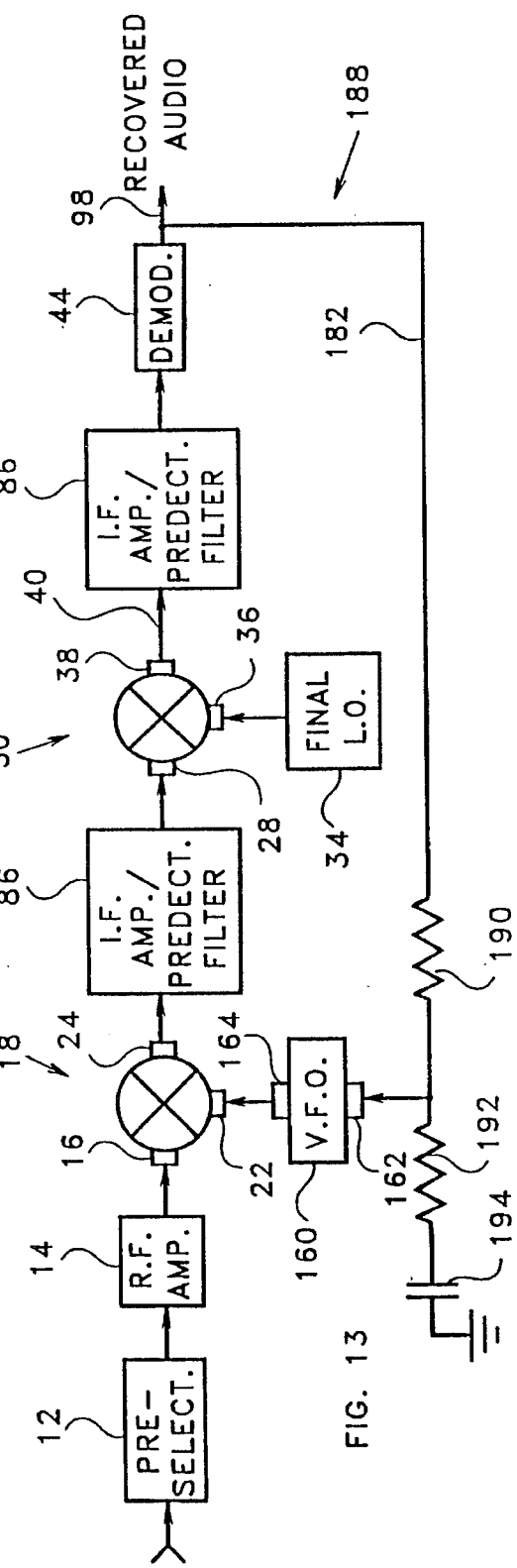

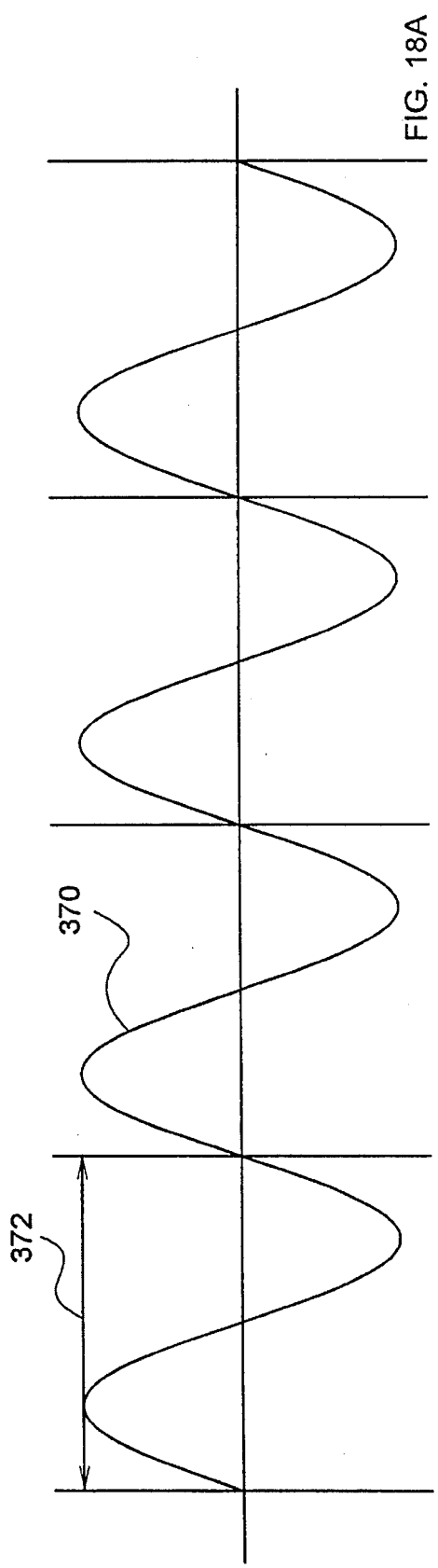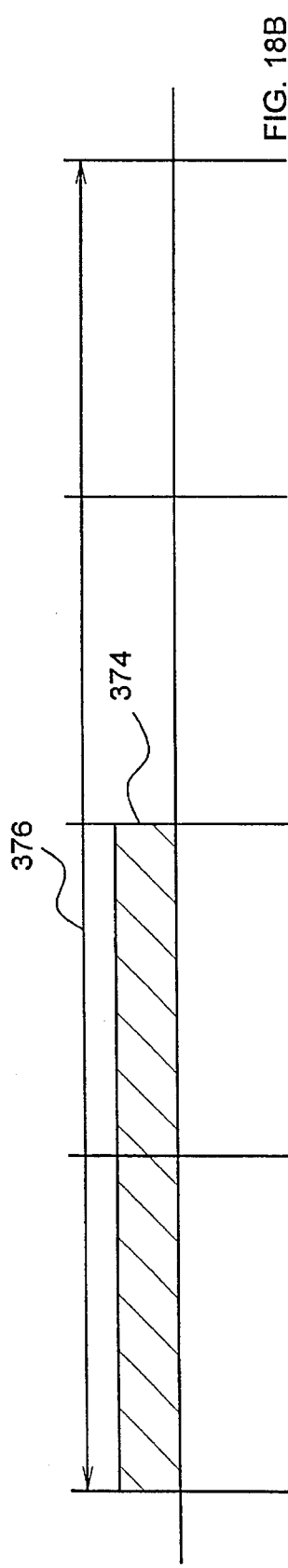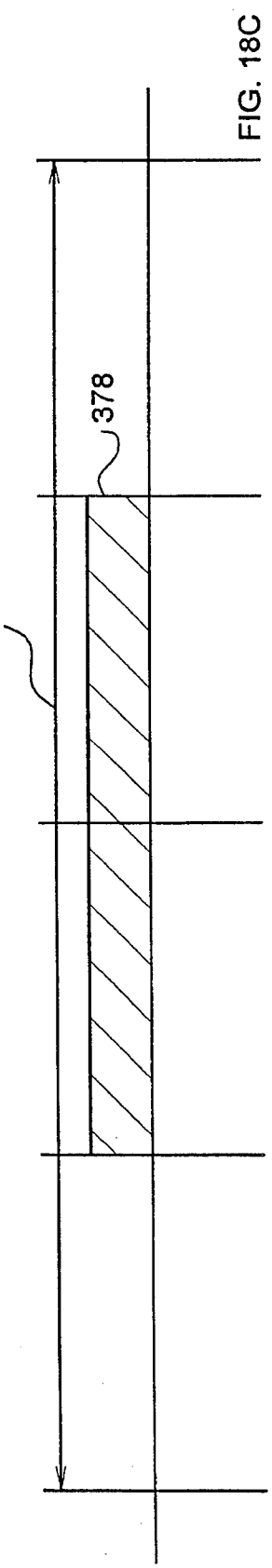

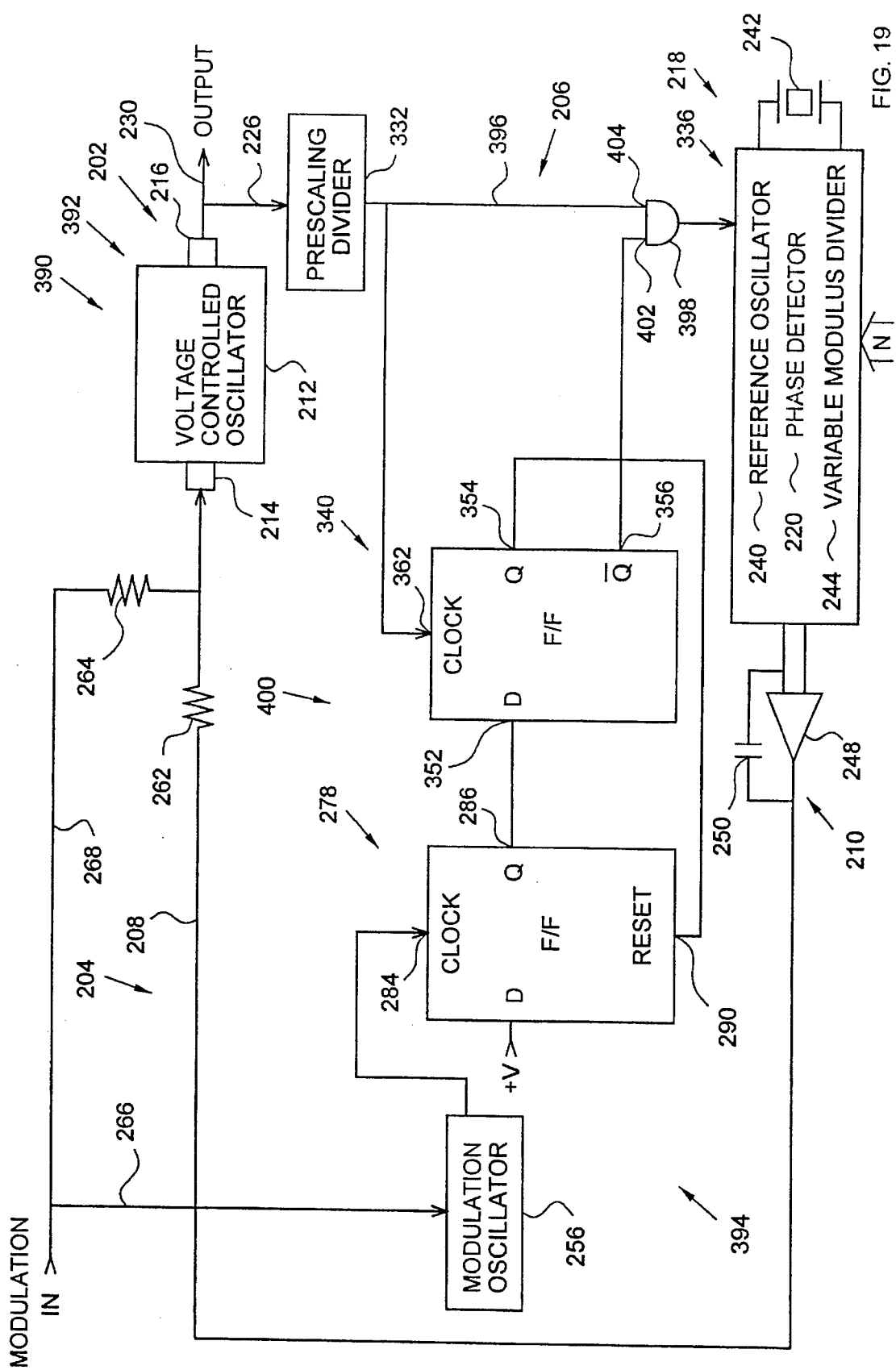

FM-PM RECEIVERS WITH INCREASED SENSITIVITY

This patent application is a Continuation-in-Part of U.S. patent application Ser. No. 07/528,654, filed 24 May 1990 now U.S. Pat. No. 5,091,706, a Continuation-in-Part of U.S. patent application Ser. No. 07/598,530, filed 16 Oct. 1990 now U.S. Pat. No. 5,097,230, and a Continuation-in-Part of PCT patent application PCT/US91/03602 filed 22 May 1991 in which the United States is designated.

BACKGROUND OF THE INVENTION

1. Field of the Invention

The present invention relates generally to receivers for angularly modulated signals. More particularly, the present invention relates to apparatus and method for increasing the sensitivity of both FM and PM receivers.

2. Description of the Related Art

In radio receivers, one of two systems for modulating the signal has generally been used: amplitude modulation, in which the amplitude of the carrier is varied, and frequency modulation, in which the frequency of the carrier is varied.

Frequency modulation is also called angular modulation, because modulation of the carrier frequency results in angular deviations in the carrier frequency, or center frequency. Also included in the category of angular modulation is phase modulation.

Phase modulation differs from frequency modulation in that the phase of the carrier frequency is varied directly, rather than directly varying the frequency of the carrier. However, phase modulation also varies the frequency of the carrier, and frequency modulation also varies the phase of the carrier. In a receiver, an FM demodulator is equal to a PM demodulator plus a differentiator, and a PM demodulator is equal to an FM demodulator plus an integrator.

Frequency modulated transmitters and receivers have been used widely, the applications including relatively unsophisticated audio radios for receiving commercial broadcasts, receiving the audio portion of consumer video, personal FM communications, amateur radio, industrial radio uses that include audio, digital data, and video, and military communications that include audio, digital data, and video.

PM transmission has enjoyed less popularity than FM transmission. The reason for this is: the phase of a carrier varies as a function of the distance between the transmitter and the receiver, and also atmospheric conditions. Therefore, when transmitting digital information, the phase of the received signal will change 180 degrees whenever the distance between the transmitter and receiver changes by a half wave length, and so, for digital communications, it becomes difficult to correlate the phase modulation with the phase of the unmodulated carrier. While various methods have been used, either at the transmitter or at the receiver, to overcome this problem, FM communications have enjoyed more popularity than PM communications.

The bandwidth required for angular modulation to pass all significant sidebands is equal to twice the product of the highest modulating signal and the number of significant sidebands as determined from the table of Bessel functions. However, the required bandwidth can be approximated by Carson's rule which states that the required bandwidth is equal to twice the sum of the peak frequency deviation and the highest modulating signal frequency.

A primary objective with any radio-frequency link is to achieve reliable communications with the least transmitter power, or to achieve reliable communications for the greatest distance. Obviously, more reliable communications over greater distances can be achieved with the same transmitter power, and with the same antenna size and complexity, if the sensitivity of the receiver can be increased.

However, atmospheric noise is nearly constant across the entire band width, and the required predetection bandwidth in all FM and PM receivers has been a function of the peak frequency deviation and the highest modulating frequency, in accordance with Carson's rule. Therefore, with a minimum and irreducible required bandwidth, it has been almost impossible to increase the signal noise ratio beyond previously achieved levels. That is, it has been almost impossible to achieve any noticeable gains in the sensitivity of FM and PM receivers.

Typically, FM and PM receivers have included: an RF input stage having a preselector and an amplifier; an IF stage having a first mixer and a first local oscillator; a second IF stage having an IF amplifier/filter, a second mixer, and a second local oscillator; and a demodulator.

Various types of demodulators, or discriminators, have been used in FM and PM receivers. However, since the advent of integrated-chip electronics, demodulators which use tuned circuits have come into disfavor because their cost is greater than demodulators which consist only of an integrated chip. Some of the demodulators which are adaptable to integrated circuits and which are presently popular include: the pulse averaging demodulator, the quadrature detector, and the phase-locked loop demodulator.

As noted above, phase-locked loop oscillators may be used in the frequency converter of the angularly modulated receiver. The discussion which follows pertains to D.C. modulated phase-locked oscillators.

The frequency of radio frequency voltage controlled oscillators (RF VCO) has been closely controlled by phase locking a feedback signal from the RF VCO to a crystal controlled reference oscillator (XO). A phase detector has been used to determine the phase difference between the feedback signal and a crystal controlled reference frequency; and an integrator has been used to summate the phase difference and to control the frequency of the RF VCO oscillator in accordance with the summated phase difference.

Improvements taught by the prior art over the basic phase locked oscillator include the use of prescalers to provide a feedback signal having a lower frequency than the RF VCO, thereby lowering the required frequency of the controlling circuitry. Prior-art improvements over the basic circuitry also include the use of a dual modulus divider to channelize the output frequency by dividing the feedback by higher and lower dividing ratios in a technique known as pulse swallowing. That is, channelizing is accomplished by swallowing, or removing, pulses in the feedback path.

SUMMARY OF THE INVENTION

In the present invention, apparatus and method are provided to increase the sensitivity of receivers for angularly modulated frequencies. The present invention achieves this increase in sensitivity by reducing the required bandwidth of the predetection filter.

The angularly modulated receivers of the present invention comprise: an rf input stage, an rf mixing stage, and a final IF stage. The rf input stage includes a preselector and an amplifier, the rf mixing stage includes a mixer and a local oscillator, and the final IF stage includes an IF amplifier/ filter, a final mixer, and a final local oscillator.

Optionally, the receivers of the present invention may include a demodulator following the final mixer. Also, the angularly modulated receivers of the present invention may include other mixing stages, each including a mixer and a local oscillator disposed intermediate of the rf stage and the final IF stage.

The improvement of the present invention is characterized by using a variable frequency oscillator for the first local oscillator, or, if there is another stage with a mixer and a local oscillator, using a variable frequency oscillator for the local oscillator in a stage preceding the final IF stage, and by controlling the frequency of this variable frequency oscillator as a function of the output of the final mixer.

In operation, the final mixer, which preferably is a phase detector, senses a phase difference between the frequency of the final local oscillator and the frequency input delivered to this mixer from the preceding mixer. This phase difference results in a voltage output from the final mixer. This voltage output of the final mixer is fed back to the variable frequency oscillator to control the frequency thereof.

Preferably, the free-running frequency of this variable frequency oscillator is equal to the center frequency of the received rf frequency, minus the frequency of any local oscillators that precede the mixer with the variable frequency oscillator.

As the final mixer senses a phase difference between the frequency of its local oscillator and the frequency received from a previous mixer, the voltage output of the final mixer controls the frequency of the variable frequency oscillator to make the frequency delivered to the final mixer equal to the frequency of the local oscillator of the final mixer. However, there exists a phase shift between the frequency delivered to the final mixer and the frequency of the final local oscillator.

Since the frequencies delivered to the final mixer are equal with a phase shift between them, the output of the final mixer is a voltage which is a function of the phase shift. This voltage output of the final mixer is the demodulated output of an FM signal, and is also used to control the frequency of the variable frequency oscillator.

Since the two frequencies entering the final mixer are equal at all times, with a phase shift between them, some of the modulation is removed before the modulated signal reaches the final mixer. Therefore, the bandwidth of the predetection filter can be narrower and the sensitivity of the receiver is increased.

In the present invention, a frequency converter, which precedes the final mixer, and which may include a mixer and a variable frequency oscillator, removes all frequency changes other than a phase shift, and the final mixer converts the phase shift to the demodulated output.

Therefore, while in prior-art receivers the demodulators have been disposed after the final mixer, the present invention disposes a portion of the demodulator, the frequency converter, intermediate of the rf input stage and the final mixer.

Further, since the final mixer receives two frequencies that are equal with a phase shift between them, and then produces a voltage output that is a function of this phase shift, the final mixer is a part of the demodulator of the present invention. Or, it is equally true to say that the present invention disposes two portions of the demodulator, namely the variable frequency device and the final mixer, intermediate of the rf input stage and the output of the final mixer.

In most embodiments of the present invention, there is no demodulator following the final mixer. However, in two embodiments of the present invention a conventional demodulator follows the final mixer. However, even though a conventional demodulator is included in these embodiments, partial demodulation is still accomplished ahead of the final mixer, and, in addition, partial demodulation is accomplished in the final mixer.

As described above, the present invention replaces a local oscillator of a mixing stage with a variable frequency oscillator. But, more broadly speaking, the present invention interposes a frequency converter intermediate of the rf input stage and the final IF stage. This frequency converter preferably includes a mixer and a variable frequency oscillator. In various embodiments, this variable frequency oscillator comprises a voltage controlled oscillator, a variable crystal oscillator, or a D.C. modulated phase-locked oscillator.

Finally, the present invention pertains to all receivers for angularly modulated signals, both FM and PM. However, in a PM receiver an integrator on the output of the final mixer is required to produce the demodulated output.

The present invention also provides D.C. modulated phase locked oscillators, each of which may be used in one of the receivers of the present invention. In various ones of these D.C. modulated phase locked oscillators pulses are removed from the feedback path, or, alternately, are added to the feedback path.

The number of pulses in the feedback path is changed by dividing at two different ratios, by mixing the frequency in the feedback path with another frequency, by preventing a low between two pulses, or by preventing a high between two pulses.

Where needed, a synchronizer is provided to synchronize the changing of the frequency in the feedback path with a modulating frequency. In channelized versions of the D.C. modulated phase locked oscillator, the synchronizer also prevents interference between modulating and channeling functions.

Preferably, the forward path is D.C. modulated substantially simultaneous to D.C. modulating of the feedback path, thereby providing almost unlimited frequency response.

More particularly, a D.C. modulated phase locked RF VCO includes a phase locked loop with a forward path, an RF VCO in the forward path that produces an output, a feedback path that is connected to the output, a crystal controlled reference oscillator, a phase detector that is connected to the crystal controlled reference oscillator and that is connected to both the feedback path and the forward path, and an integrator in the forward path that controls the frequency of the voltage controlled oscillator in response to integrated differences in the phase between said reference oscillator and the frequency in the feedback path.

The means for D.C. modulating the RF VCO includes a dual modulus divider that is interposed into the feedback path, and a modulation oscillator that is connected to the dual modulus divider and that causes the dual modulus divider to divide by a higher dividing ratio for each cycle of the audio oscillator. Preferably, the modulation oscillator is a voltage controlled audio oscillator (AF VCO).

Therefore, the dual modulus divider cooperates with the voltage controlled audio oscillator to remove one pulse from the feedback path for each cycle of the audio oscillator. The RF VCO is then caused by the loop to increase its output frequency to exactly compensate for these removed pulses. The result is that the frequency of the audio frequency oscillator is added to the frequency of the oscillator. D.C. modulation of the output is therefore achieved by D.C. modulating the voltage input to the voltage controlled audio frequency oscillator.

Optionally, the RF VCO is D.C. modulated substantially simultaneously with modulating of the feedback path in order to increase the frequency response of the loop.

Further, the present invention includes means for synchronizing the changing of dividing ratios in accordance with completion of dividing at one of the ratios. In one embodiment, this means for synchronizing includes first and second flip-flops, and an OR gate. In another embodiment, this means for synchronizing includes combinations of such elements as an AND gate, an invertor, a resistor, and a diode.

Optionally, a prescaling divider is used in the feedback path to reduce the frequency of the feedback signal prior to dividing the feedback signal by the dual modulus divider. This addition allows a higher frequency oscillator to be similarly controlled without exceeding the frequency limitations of the dual modulus divider.

Further, the use of a prescaling divider reduces the required frequency of the audio oscillator for any given desired range of frequency modulation.

In another embodiment, suitable primarily for lower frequencies, the dual modulus divider is omitted, and a pair of bistable multivibrators, or flip-flops, are used to synchronize the modulation oscillator with the pulses in the feedback path, and a resistor and a diode are used to remove one pulse from the feedback path for each cycle of the modulation oscillator, or even to effectively remove as many as hundreds of pulses from the feedback path for each cycle of the modulation oscillator.

In still another embodiment, the means for D.C. modulating a phase locked loop includes a modulation oscillator, a pair of flip-flops, or bistable multivibrators, that are connected to the modulation oscillator and that produce two square-wave outputs that are phase shifted 90 degrees, one to the other, to produce quadrature outputs, and a quadrature phase shift keying (QPSK) mixer that is interposed into the feedback path of the phase locked loop, and that is connected to both quadrature outputs.

The QPSK mixer produces both sidebands as mixed with the frequencies in the feedback path, but attenuates the one which is higher than the frequencies in the feedback path, thereby lowering the frequencies in the feedback path as a function of the frequencies of the modulation oscillator.

Then, to keep the loop phase locked, the phase detector and the integrator cooperate to increase the voltage applied to the voltage controlled oscillator in the feedback loop, and thereby increase the output frequency of the voltage controlled oscillator.

In this embodiment also, the RF VCO is D.C. modulated substantially simultaneously with modulating of the feedback path in order to increase the frequency response of the loop.

In still another embodiment of the present invention, a dual modulus divider, having lower and higher dividing ratios, is interposed into the feedback path; a modulus controller, having "A" and "N" inputs which control the number of times that the dual modulus divider divides at each of the two dividing ratios, is connected to the dual modulus divider; a modulation oscillator, which produces modulation frequencies, is connected to a parallel adder by a synchronizer; and the parallel adder increases the "A" count of the modulus controller as a function of the frequencies of the modulation oscillator.

As the "A" count of the modulus controller is increased, an additional division is performed on the frequency in the feedback path, lowering the frequency in the feedback path, and thereby requiring that the output frequency in the forward path increase to maintain the loop in phase locked condition.

Optionally, the forward path is D.C. modulated substantially simultaneously with modulation of the feedback path, as described for the other embodiments.

In embodiments using a dual modulus divider, by changing the normal state of the dual modulus divider to divide at the higher dividing ratio, pulses are added to the feedback path rather than being removed.

The exceptionally low frequency drift of the present invention is attributable to the inherent stability of the crystal controlled reference oscillator, and the low frequency drift of the modulation oscillator which, preferably, is in the audio frequency range.

The proliferation of uses for various frequency bands has resulted in crowding of the bands, and in an accompanying need to increase the number of channels in a given band. However, the limitation in the number of channels that can be accomplished depends to some measure upon the band width that must be allocated to expected frequency drift over time and temperature.

Until recently, for military communication bands, a frequency drift of ±0.003 percent was allowed, but now specifications have been tightened to allow only ±0.002 percent.

Assuming a frequency drift of ±0.003 percent in the 2200 to 2400 MHZ band, and assuming the mid point of the band, this allowable frequency drift could result in a drift of ±69 KHZ or a total drift of 138 KHZ.

The present invention provides transmitters in which not only are drift specifications of ±0.002 percent readily attainable, but also the transmitters of the present invention can be manufactured to hold the frequency drift within ±0.001 percent should this specification be further tightened.

Since the frequency drift of voltage controlled oscillators is a smaller percentage with lower frequency designs, the frequency drift of the RF VCO is reduced by dividing the feedback frequency by a larger dividing ratio and using a lower modulation frequency, even though the effect of each cycle of the modulation frequency, and the drift of the modulation oscillator, is multiplied by the dividing ratio.

However, a reduced frequency in the feedback path results in a lower frequency response of the system. The use of a shift register also reduces the required frequency of the audio oscillator; but it does not deteriorate the frequency response, as does the use of a prescaling divider.

Without regard to frequency response, in preferred embodiments the present invention provides almost instantaneous modulation of the output in response to a modulation signal, since the forward path is modulated as well as the feedback path. Therefore, while the time to phase lock is dependent upon the frequency in the feedback path, the time to D.C. modulate the output is almost instantaneous without regard to the frequency in the feedback path.

Optionally, the present invention utilizes two separate means for controlling the dual modulus divider. One of these controlling means is the D.C. modulating means of the audio frequency voltage controlled oscillator; and the other controlling means provides means for channelizing the output.

That is, the dual modulus divider is controlled to remove pulses in the feedback path to provide D.C. modulation of the output; and the dual modulus divider is separately controlled to remove pulses in the feedback path at a rate in which the output is shifted to a given frequency channel.

The synchronizer of the present invention prevents interruption of the control of the dividing ratios of the dual modulus divider by one of the controlling means while the other controlling means is controlling the dual modulus divider.

Considering only the signal processing apparatus and method thereof, the present invention can be better seen in the following aspects.

In a first aspect, of the present invention, a method is provided for processing angularly modulated signals that includes the steps of preselecting an angularly modulated signal, filtering the angularly modulated signal, mixing the angularly modulated signal with an other signal, and producing a demodulated output of the angularly modulated signal, which method is characterized by reducing the required bandwidth of the filtering step below the value calculated by Carson's rule by modifying the preselected signal prior to the filtering step; reducing the bandwidth of the filtering step below the value calculated by Carson's rule; phase locking an output frequency to a reference frequency; the first reducing step comprises converting the angularly modulated signal as a function of the phase locked output frequency; and the first reducing step further comprises D.C. modulating the phase locked output frequency as a function of the demodulated output without varying the reference frequency.

In a second aspect of the present invention, a method is provided which comprises receiving an angularly modulated signal that includes modulation deviations, reducing the deviations subsequent to the receiving step, and producing a demodulated output of the angularly modulated signal subsequent to the reducing step, the improvement in which the reducing step is characterized by phase locking an output frequency to a reference frequency; D.C. modulating the phase locked output frequency as a function of the demodulated output without varying the reference frequency; and converting the angularly modulated signal as a function or the phase locked output frequency.

In a third aspect of the present invention, signal processing apparatus is provided which comprises preselector means for preselecting a modulated signal that includes deviations, reducing means for reducing the deviations, and processing means, including the reducing means, for producing a demodulated output of the modulated signal, the improvement in which the reducing means comprises phase locking oscillator means for supplying an output frequency to the processing means that is phase locked to a reference frequency; and D.C. modulator means, being operatively connected to the demodulated output and to the phase locking oscillator means, for D.C. modulating the phase locked output frequency as a function of the demodulated output without changing the reference frequency.

In a fourth aspect of the present invention, a method is provided for processing angularly modulated signals which comprises forming a closed loop, developing a reduced frequency in the closed loop, and producing a demodulated output or the reduced frequency, the improvement which is characterized by phase locking an output frequency of a second closed loop, that includes both a forward path and a feedback path, to a reference frequency; interposing the second closed loop into the first closed loop; supplying the phase locked output frequency to the first closed loop; deriving a signal from the first closed loop; D.C. modulating the feedback path of the second closed loop as a function of the derived signal without varying the reference frequency; and separately modulating the forward path of the second closed loop as a function of the derived signal.

In a fifth aspect of the present invention, signal processing apparatus is provided which comprises preselector means for preselecting an angularly modulated signal, and means, including a closed loop, for producing a demodulated output of the angularly modulated signal, the improvement which is characterized by phase locking oscillator means, having an output frequency that is phase locked to a reference frequency, and being operatively interposed into the closed loop, for supplying the phase locked output frequency to the closed loop; and D.C. modulator means, being operatively connected to both the phase locking oscillator means and the demodulated output, for D.C. modulating the phase locked output frequency in response to the demodulated output without changing the reference frequency.

In a sixth aspect of the present invention, signal processing apparatus, including a closed loop, is provided for processing angularly modulated signals, the improvement which is characterized by phase locking oscillator means, having both a forward path and a feedback path, being interposed into the closed loop, and having an output frequency that is phase locked to a reference frequency, for supplying the phase locked output frequency to the closed loop; means for deriving a signal from the closed loop; D.C. modulator means, being operatively interposed into the closed loop, being operatively connected to the phase locking oscillator means and to the derived signal, for D.C. modulating the feedback path in response to the derived signal without changing the reference frequency; arid means, being operatively connected to the forward path and to the derived signal, for modulating the forward path in response to the derived signal.

BRIEF DESCRIPTION OF THE DRAWINGS

FIG. 1 is a schematic drawing of a typical FM receiver of prior-art design;

FIG. 2 is a schematic drawing of a prior-art integrator for converting an FM demodulator into a PM demodulator;

FIG. 3 is schematic drawing of a prior-art demodulator of the phase locked loop type, and is usable with FM receivers such as the one shown in FIG. 1;

FIG. 4 is a schematic drawing of a first embodiment of the present invention for processing angularly modulated signals in which the need for a demodulator, following the final mixer, is obviated, and in which a signal derived from the final mixer is used to reduce the required bandwidth of the filter preceding the final mixer;

FIG. 5 is an embodiment of the invention in which a phase detector is substituted for the final mixer;

FIG. 6 is an embodiment of the present invention in which an extra conversion stage is included, and the frequency converter of the present invention is interposed intermediate of first and final mixers;

FIG. 7 is an embodiment of the present invention in which an extra conversion stage is included, and the frequency converter of the present invention is disposed ahead of both mixers;

FIG. 8 is an embodiment of the present invention in which a mixer and a variable frequency oscillator replace the frequency converter of the FIG. 4 embodiment;

FIG. 9 is an embodiment of the present invention in which a mixer and a variable crystal oscillator replace the frequency converter of the FIG. 4 embodiment;

FIG. 12 is an embodiment of the present invention in which a conventional demodulator is used following the final mixer, and in which a signal derived from the demodulator is used to reduce the required bandwidth of the predetection filter.

FIG. 13 is an embodiment of the present invention in which added circuitry changes the frequency of the variable frequency oscillator to reduce the frequency excursion of the variable frequency oscillator that is required to partially demodulate angularly modulated signals ahead of the final mixer;

FIGS. 18a–18c are graphs of the frequency of the modulation oscillator and both first and second square waves that are developed by the pair of flip-flops and that are phase shifted, one from the other, to provide quadrature frequencies for use by the quadrature phase shift keying (QPSK) mixer of the FIG. 17 embodiment;

FIG. 19 is a schematic drawing of an embodiment in which an AND gate performs the pulse swallowing function of the resistor and diode of the FIG. 16 embodiment.

DESCRIPTION OF THE PREFERRED EMBODIMENTS

Figures 10, 11:
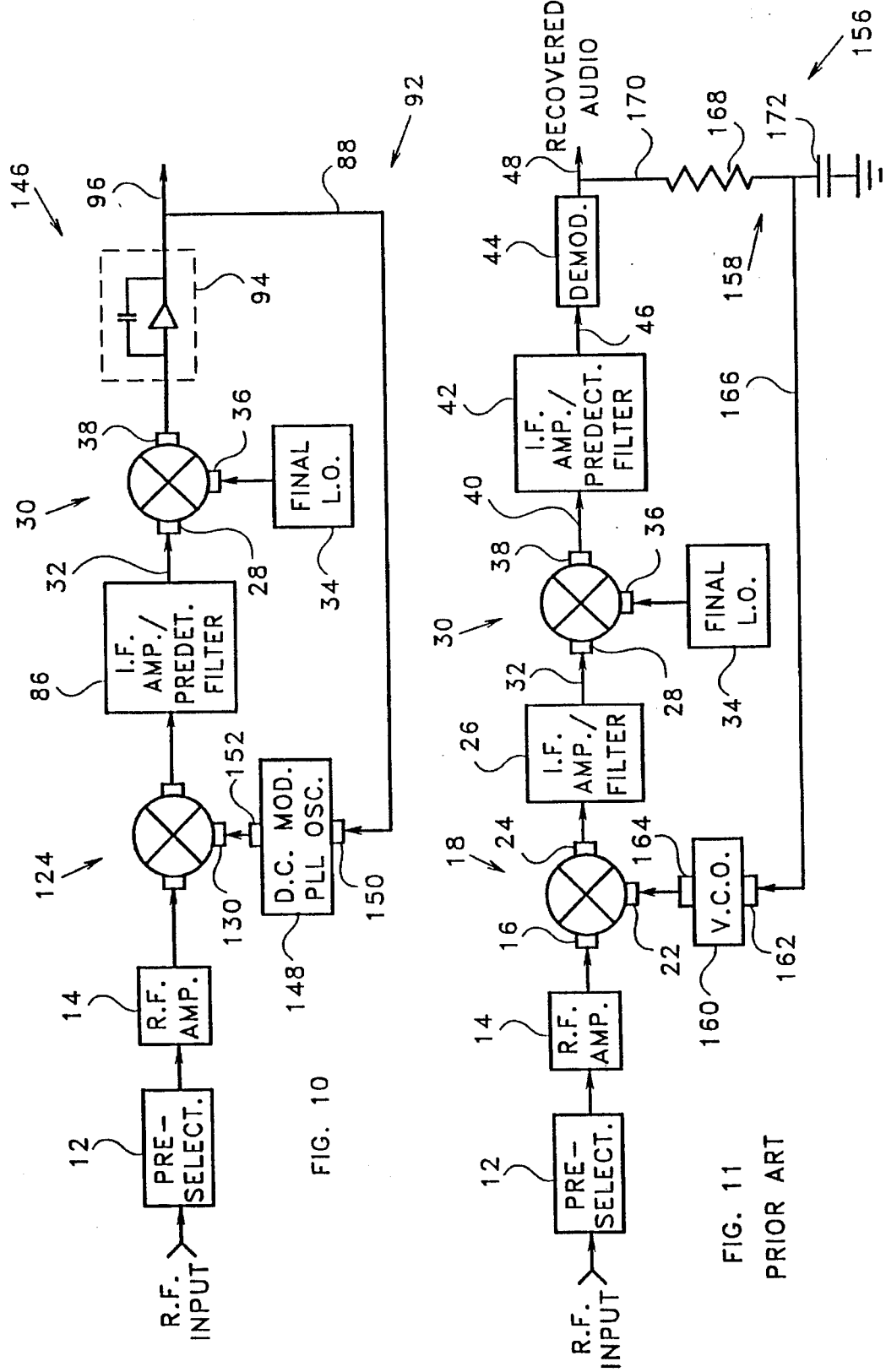
FIG. 10 is an embodiment of the present invention in which a mixer and a D.C. modulated phase locked oscillator replace the frequency converter of the FIG. 4 embodiment.
FIG. 11 is a prior-art FM receiver with automatic frequency control.

Referring now to the drawings, FIGS. 1–13 pertain to receivers for angularly modulated signals. More particularly, FIGS. 1–3 and 11 show prior-art FM receivers, and FIGS. 4–10, 12, and 13 show various embodiments of the present invention.

The receiver of FIG. 10 uses a D.C. modulated phase locked oscillator, and the present invention includes various D.C. modulated phase locked oscillators, each of which may be used in the receiver of FIG. 10.

Figure 14:
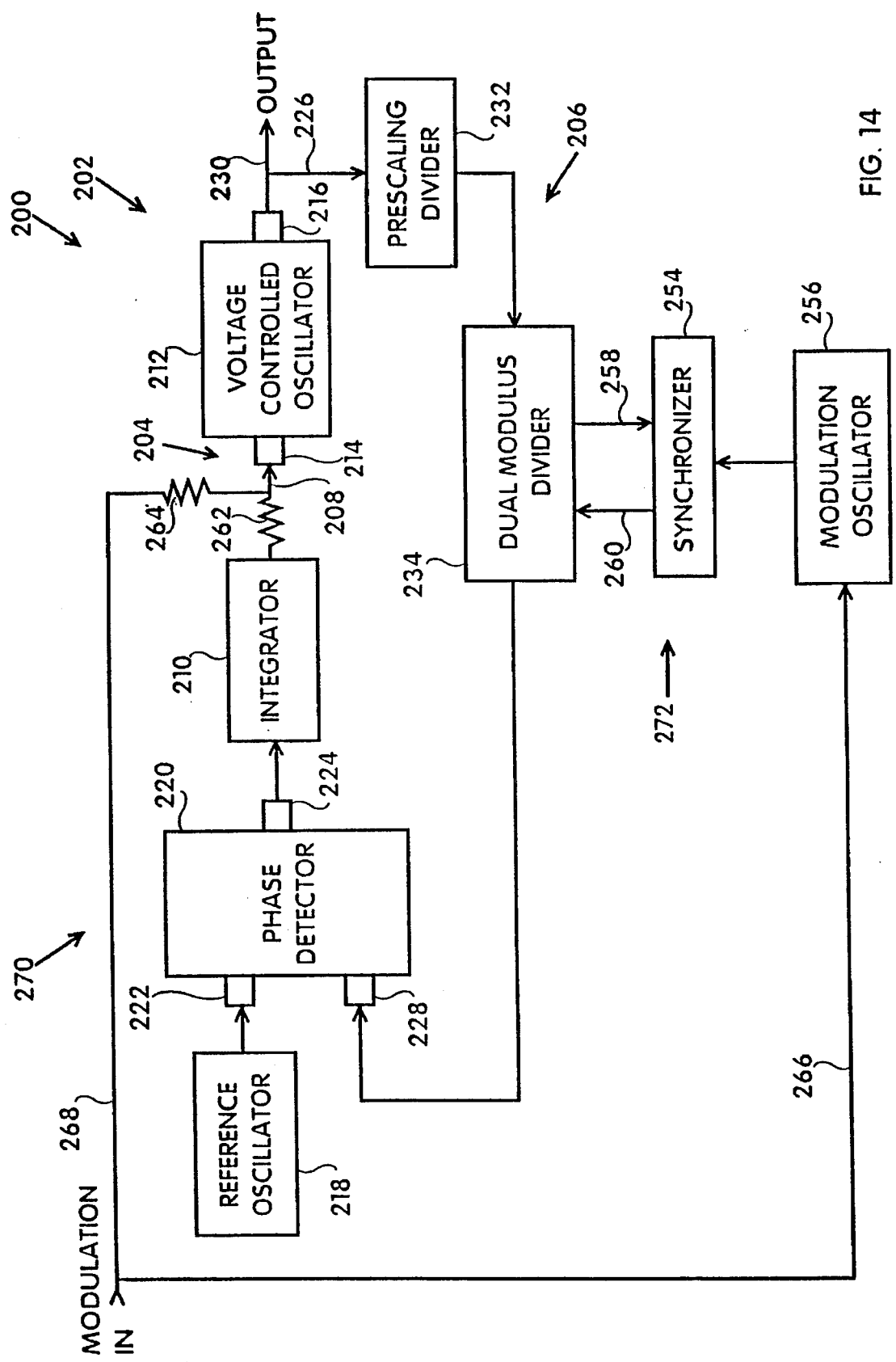
FIG. 14 is a schematic drawing of an embodiment a D.C. modulated phase locked oscillator of the present invention in which a dual modulus divider and a synchronizer cooperate to D.C. modulate the feedback path, and in which the forward path is also D.C. modulated.
Figure 15:
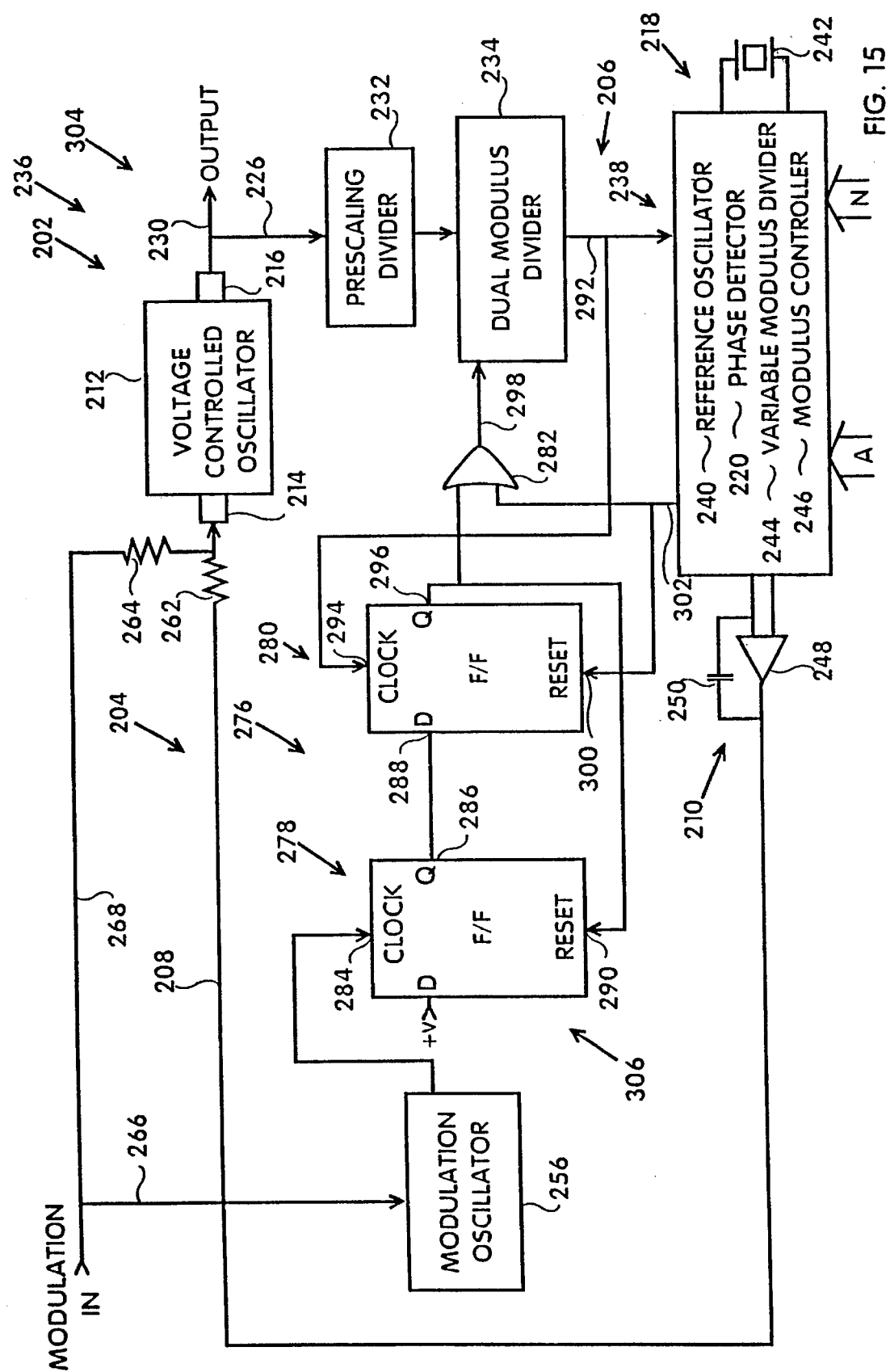
FIG. 15 is a schematic drawing of the present invention in which the synchronizer of FIG. 14 includes two flip-flops and an OR gate, some of the components of FIG. 14 are included in an integrated chip, and a modulus controller cooperates with the dual modulus divider to provide channelization.

The D.C. modulated phase-locked loop oscillators of FIGS. 14 and 15 are also shown and described in: U.S. patent application Ser. No. 07/528,654, filed 24 May 1990; U.S. patent application Ser. No. 07/598,530 filed 16 Oct. 1990; and PCT patent application PCT/US91/03602 filed 22 May 1991 in which the United States is designated.

Figure 16:
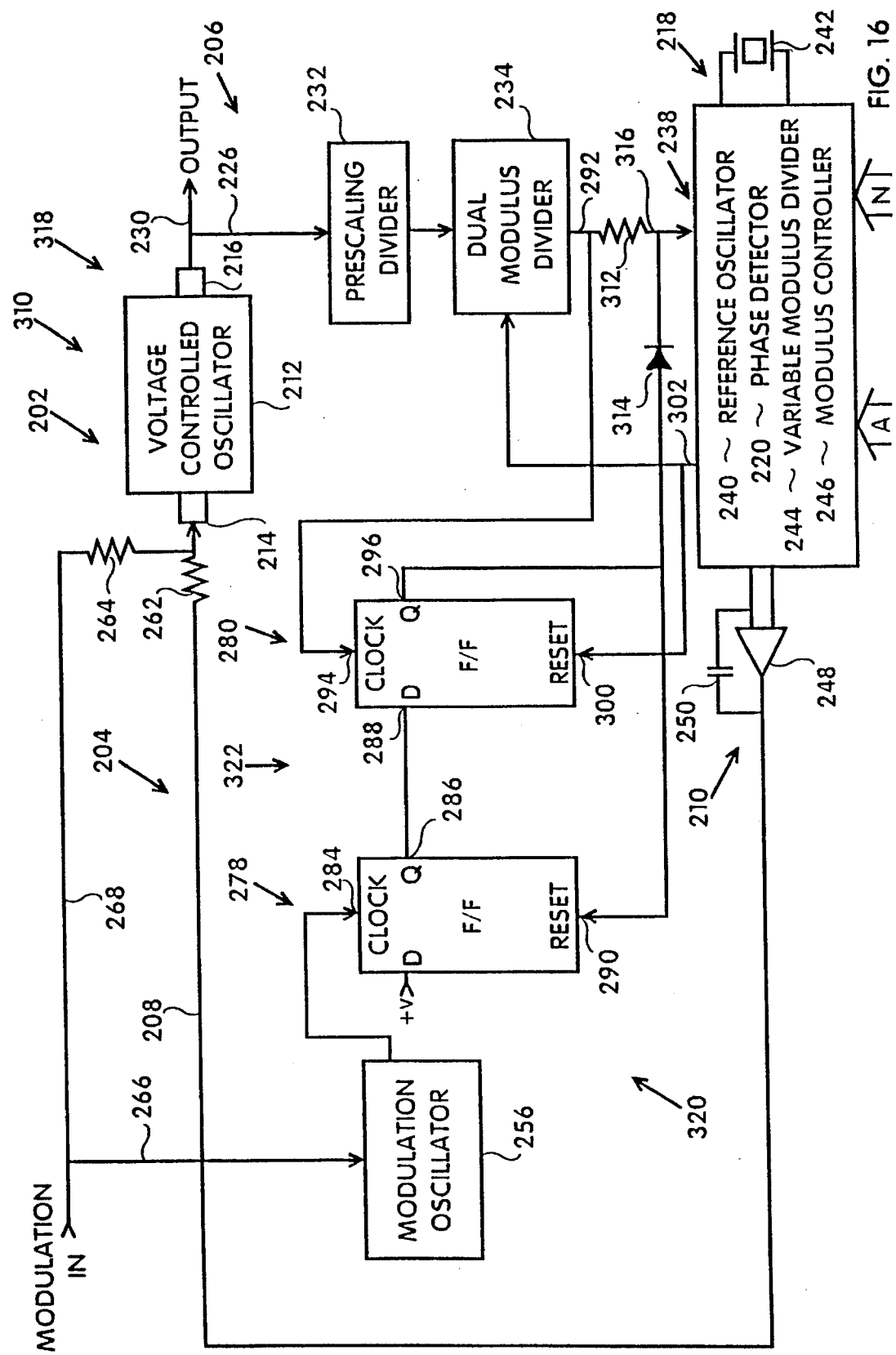
FIG. 16 is a schematic drawing of the present invention in which a resistor and a diode are used in conjunction with a dual modulus divider and a modulus controller to achieve extremely wide frequency modulation of a phase locked output.
Figure 17:
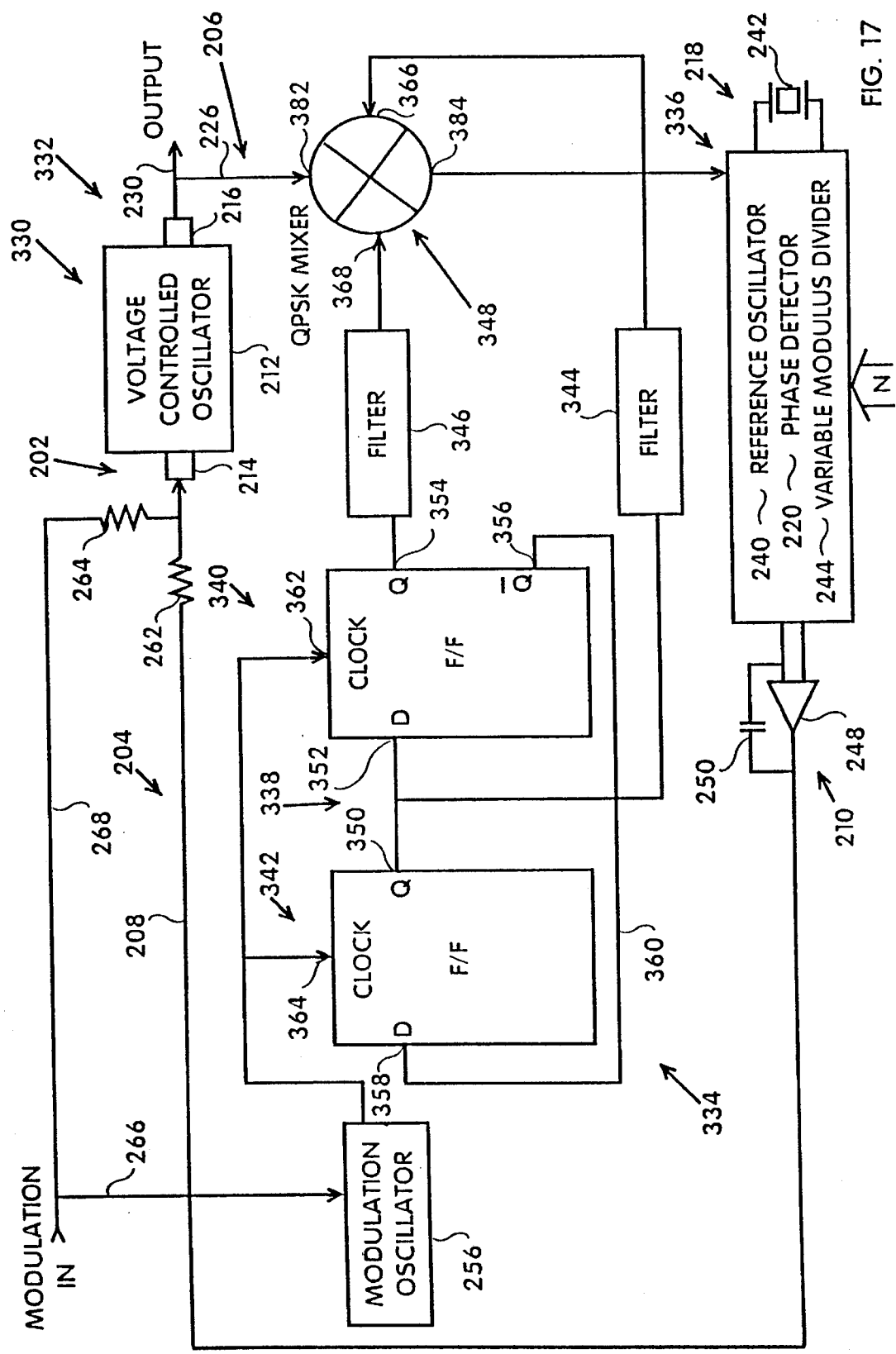
FIG. 17 is a schematic drawing of the present invention in which two flip-flops develop quadrature frequencies from the modulation frequencies, and a quadrature phase shift keying mixer, that produces a single sideband, uses this one sideband to lower the frequencies in the feedback path.

The D.C. modulated phase-locked oscillators of FIGS. 16 and 17 are shown and described in U.S. patent application Ser. No. 07/598,530 filed 16 Oct. 1990, and in the aforesaid PCT patent application. And, the D.C. modulated phase-locked oscillator of FIG. 19 is shown and described in the aforesaid PCT patent application.

Figure 20:
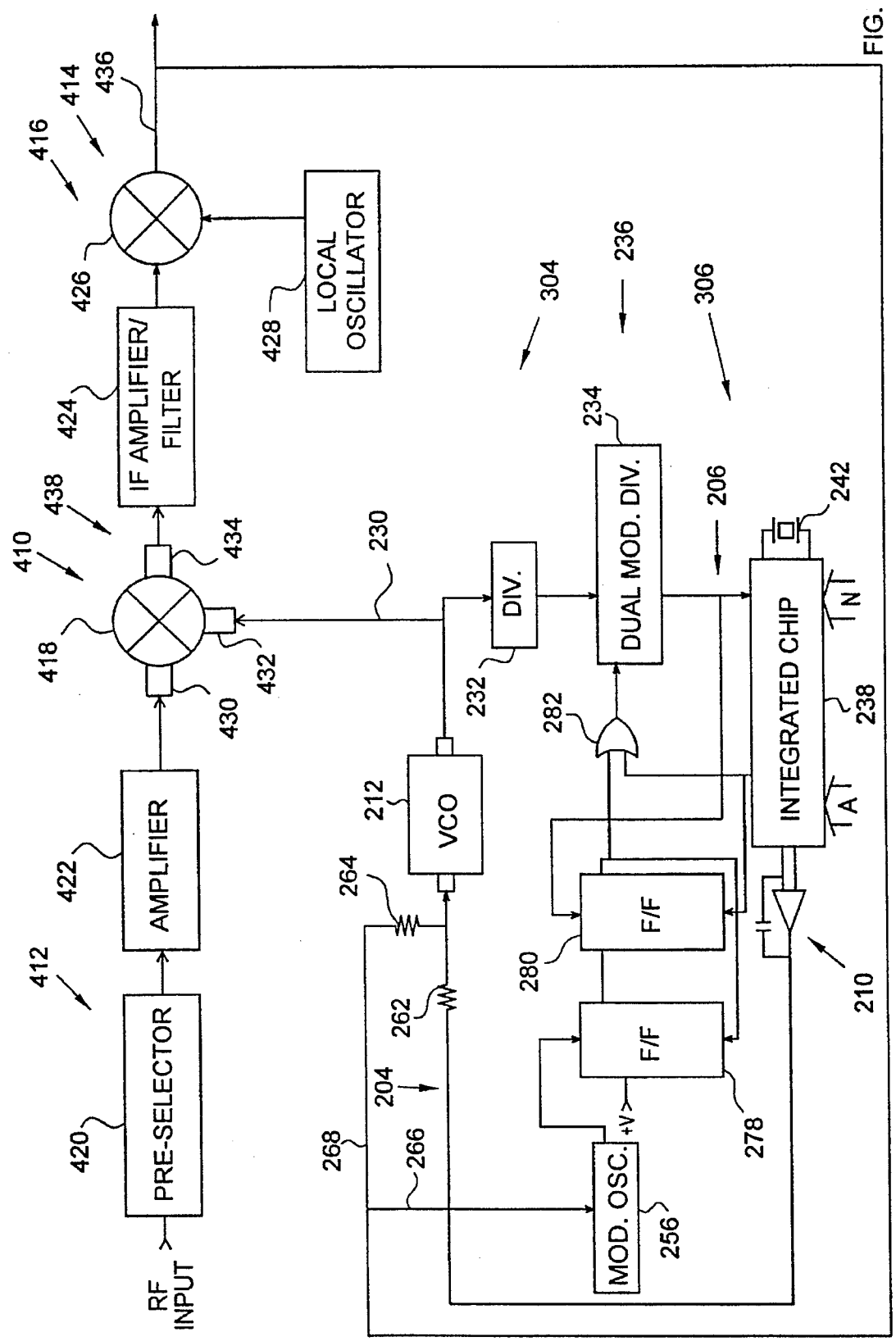
FIG. 20 is a channelized radio receiver of the present invention in which the D.C. modulated oscillator of FIG. 15 is used in the signal processing apparatus of FIG. 10.

Finally, the receiver of FIG. 20 is shown and described in both of the aforesaid U.S. patent applications. While the receiver of FIG. 10 may be constructed using any D.C. modulated phase-locked oscillator, or any other device that accomplishes the same functions, if the receiver of FIG. 10 is constructed using the D.C. modulated phase locked oscillator of FIG. 15, the combination becomes the receiver of FIG. 20.

Referring now to FIG. 1, in a prior-art FM receiver 10 for processing frequency modulated signals, a preselector 12 receives rf angularly modulated signals, preselects a given angularly modulated signal, and delivers the preselected signal to an rf amplifier 14. The rf amplifier 14 amplifies the preselected rf signal and delivers the amplified rf signal to a first input 16 of a first mixer 18.

The local frequency of a first local oscillator 20 is delivered to a second input 22 of the first mixer 18, the amplified rf signal in the first input 16 is mixed in the first mixer 18 with the frequency of the first local oscillator 20, the mixed output is produced at an output 24 of the first mixer 18, and the mixed output of the first mixer 18 is delivered from the output 24 of the first mixer 18 to an IF amplifier/filter 26.

The filter in the IF amplifier/filter 26 selects one sideband of the first mixer 18 and delivers the selected sideband to a first input 28 of a final mixer 30 via a conductor 32, a frequency of a final local oscillator 34 is delivered to a second input 36 of the final mixer 30, an output 38 of the final mixer 30 delivers the mixed output via a conductor 40 to an IF amplifier/predetection filter 42.

The predetection filter in the IF amplifier/predetection filter 42 places a final restriction on the bandwidth for the selected signal, and delivers the finally selected signal to a demodulator 44 via a conductor 46. The demodulator 44 demodulates the selected signal and delivers the demodulated output to a demodulated output conductor 48.

The demodulator 44 may be of any of the classical types of discriminators or demodulators which were used prior to the advent of integrated circuits, or the demodulator 44 may be of a more contemporary design, such as: the pulse averaging demodulator, the quadrature detector, or the phase-locked loop demodulator.

Referring now to FIGS. 1 and 2, as described above, the prior-art FM receiver 10 of FIG. 1 includes the demodulator 44 which, so far as has been described, functions only with FM signals. However, an FM demodulator plus an integrator equals a PM demodulator. Therefore, if an integrator 50 of FIG. 2 is attached to the demodulated output conductor 48 of FIG. 1, then the demodulated output of a PM signal, is produced at a demodulated output conductor 52 which is attached to the integrator 50.

As noted above, the prior-art FM receiver 10 is a FM receiver if the integrator 50 is omitted, and it is a PM receiver if the integrator 50 is included. Therefore, since both FM and PM signals are included in angularly modulated signals, and since the receivers in the following descriptions become PM receivers with the addition of the integrator 50, the receivers in the following descriptions will be called angularly modulated receivers.

Referring now to FIG. 3, a phase-locked loop demodulator 54, which may be used in place of the demodulator 44 of FIG. 1, is of the phase-locked loop type. The phase-locked loop demodulator 54 is connected to the conductor 46 of FIG. 1, receives a finally selected signal within a predetermined bandwidth from the IF amplifier/predetection filter 42 and delivers this signal to a first input 56 of a phase detector 58.

The phase detector 58 senses a phase difference between the signal delivered to the first input 56 thereof and a signal delivered to a second input 60 of the phase detector 58. This phase difference, between the signals delivered to the inputs, 56 and 60, produces a voltage at an output 62 of the phase detector 58. This voltage output at the output 62 of the phase detector 58 is delivered by a conductor 64 to a filter 66 wherein it is filtered. The output of the filter 66, in a demodulated output conductor 68, is the demodulated output of the rf input of the prior-art FM receiver 10 of FIG. 1.

Also, the voltage output of the phase detector 58, as it senses the phase difference between signals received at the first inputs, 56 and the second input 60, is delivered from the output 62 of the phase detector 58 to an integrator 72 via the conductor 64. The integrator 72 integrates this voltage output of the phase detector 58, the integrated output of the integrator 72 is delivered to an input 74 of a voltage controlled oscillator 76, and the voltage controlled oscillator 76 produces a frequency at an output 78 that is a function of the voltage delivered to the input 74 thereof. The frequency output of the voltage controlled oscillator 76 is fed back from the output 78 of the voltage controlled oscillator 76 to the second input 60 of the phase detector 58 via a feedback conductor 80, thereby phase locking the phase locked loop demodulator 54.

Therefore, as the phase detector 58 senses a phase difference between the inputs, 56 and 60, and the frequency of the voltage controlled oscillator 76 changes to phase lock the phase locked loop demodulator 54, the voltage output of the phase detector 58 is the demodulated output, even though this demodulated output requires filtering in the filter 66.

For the receiver 10 of FIG. 1, without regard to the type of demodulator 44, and for other prior-art receivers that receive and process angularly modulated signals, both frequency modulated and phase modulated, the required bandwidth of the predetection filter in the IF amplifier/predetection filter 42, to pass all significant sidebands, is equal to twice the product of the highest modulating frequency and the number of significant sidebands, where the number of significant sidebands is determined from the table of Bessel functions.

Or, the required bandwidth of this predetection filter can be calculated by Carson's rule which states that the required bandwidth is equal to twice the sum of the peak frequency deviation and the highest modulation signal frequency. However, Carson's rule produces bandwidth requirements that are somewhat narrower than the actual bandwidths that are required to pass all significant sidebands.

The significance of this predetection bandwidth requirement is that, since atmospheric noise is substantially constant without regard to frequencies, the quantity of noise that enters the demodulator is a direct function of the bandwidth of the preselector filter.

This means that the signal to noise ratio of frequency modulated signals, and of phase modulated signals, both of which are called angularly modulated signals, has been determined by fixed, and irreducible, bandwidth requirements. Therefore, in prior-art receivers, there has been a fixed and unmovable barrier to increasing the sensitivity of receivers for angularly modulated signals.

However, in the present invention, the required bandwidth is reduced below the required bandwidth as calculated from the Bessel tables, and it is also reduced below the required bandwidth as calculated by Carson's rule. Therefore the present invention: reduces the required bandwidth of the predetection filter, reduces noise, and thereby increases the sensitivity of both FM and PM receivers.

Referring now to FIG. 4, in a first embodiment of the present invention, a signal processing apparatus, or receiver, 82, for processing angularly modulated signals, includes the components as named, numbered, and described in conjunction with the prior-art FM receiver 10 of FIG. 1, except as described below.

More particularly, the signal processing apparatus, or receiver, 82 of FIG. 4 includes the preselector 12, the rf amplifier 14, the final mixer 30, and the final local oscillator 34.

However, in the place of the first mixer 18 and the first local oscillator 20 of the prior-art receiver of FIG. 1, the receiver 82 of the present invention includes a frequency converter 84, and, in place of the IF amplifier/filter 26 of FIG. 1, the receiver 82 of FIG. 4 includes an IF amplifier/ predetection filter 86 whose bandwidth is much narrower than the bandwidth of the filter in the amplifier/filter 26 of FIG. 1. More particularly, the bandwidth of the filter in the IF amplifier/filter 86 is only a fraction of the required bandwidth as calculated by Carson's rule.

Also omitted from the embodiment of FIG. 4 is the IF, amplifier/predetection filter 42, and in addition, the FIG. 4 embodiment of the present invention obviates the need for the demodulator 44 of FIG. 1.

Continuing to refer to FIG. 4, in operation, a rf signal within a preselected bandwidth, for instance 2200 MHz, is selected by the preselector 12 and is amplified by the rf amplifier 14. Assuming for a moment that this preselected rf signal is reduced by 1700 MHz in the frequency converter 84, then a signal of 500 MHz, plus modulation frequencies, is delivered to the final mixer 30.

Then, If the final local oscillator 34 produces a frequency of 500 MHz, the lower sideband output of the final mixer 30, at the output 38, will be the modulation frequency that was imposed upon a 2200 MHz carrier at the transmitter (not shown, not a part of the present invention).

As the final mixer 30 begins to sense frequencies in the inputs, 28 and 36, thereof that are different, a phase shift between the two frequencies is sensed by the final mixer 30, and a voltage is produced at the output 38 of the final mixer 30 that is a function of this phase shift. This voltage produced in the final mixer 30 is fed back to the frequency converter 84 via a feedback conductor 88.

It was assumed that the preselector 12 has selected an angularly modulated signal with a center frequency of 2200 MHz, and that the frequency converter 84 had reduced this signal by 1700 MHz. However, voltages fed back to the frequency converter 84, via the feedback conductor 88, continuously change as a function of the phase shift between the frequencies at the first input 28 and the second input 36 of the final mixer 30.

As the voltages produced at the output 38 of the final mixer 30 are fed back to the frequency converter 84 via the feedback conductor 88, the frequency at an output 90 of the frequency converter 84 is controlled, by the voltage output of the final mixer 30, to be equal to the frequency of the final local oscillator 34, with a phase shift between the two frequencies.

That is, the frequency of the frequency converter 84 is controlled, by the output of the final mixer 30, to produce a constant frequency at the output 90 of the frequency converter 84. Or, to say it another way, all modulation frequencies are removed in the frequency converter 84, and the modulation frequencies are represented in differences in phase between the output of the frequency converter 84 and the final local oscillator 34.

The result is, in an optimized system, that there is no frequency output from the final mixer 30 on the lower sideband, because the frequency delivered to the first input 28 and the second input 36, of the final mixer 30, remain equal at all times except for a phase shift between the first input, 28 and the second input 36. The quantity of this phase shift is a function of the maximum deviation of the modulation frequencies, and it is a function of the gain of a feedback loop 92 that includes the feedback conductor 88 and the frequency converter 84.

An integrator 94, which has been added in phantom lines in FIG. 4, is shown interposed into the feedback conductor 88, but does not include any discrete parts that are separate from the above-named parts. Instead, the integrator 94 depicts the integrating functions that are inherent in the combination of the final mixer 30 and in the frequency convertor 84. However, it is believed that the use of an actual integrator in this location might be beneficial, or even necessary, in some embodiments of the present invention.

Also, as pointed out previously, the FIG. 4 embodiment of the present invention omits the use of the IF amplifier/predetection filter 42 which was shown and described in conjunction with the prior-art embodiment of FIG. 1. Even though the final mixer 30 produces two sidebands, which are zero and 1 GHz in the above example, tests have proven that the filter of the IF amplifier/predetection filter 42 of FIG. 1 is not necessary to select the correct sideband. Apparently this is due to the inherent integrating, or filtering, function performed by the final mixer 30 and the frequency converter 84, as indicated by the integrator 94.

A processed signal conductor 96 is connected to the feedback conductor 88 intermediate of the integrator 94 and the frequency converter 84, and the voltage in the processed signal conductor 96 is the demodulated output of a FM signal. If this output is integrated, using any suitable device such as the integrator 50 of FIG. 2, the output in the demodulated output conductor 52 of FIG. 2 becomes the demodulated output of a PM signal.

Referring again to FIG. 4, Since no demodulator is included in the signal processing apparatus 82 following the final mixer 30, it is correct to say that at least partial demodulation occurs prior to the output 38 of the final mixer 30. This is correct even if it is assumed that the phantom integrator 94 performs a part of the demodulation process, even if an integrator made of discrete part (not shown) is used in place of, or in addition to, the phantom integrator 94, and even if the integrator 50 of FIG. 2 is used to perform a part of the demodulation process.

Further, since the frequency output of the frequency convertor 84 is maintained equal to the frequency of the final local oscillator 34, except phase shifts between the two frequencies, it is clear that the modulation frequencies, except for phase shifts thereof, are removed in the frequency converter 84. Therefore, it is correct to say that partial demodulation occurs in the frequency converter 84. Also, it is equally correct to say that partial demodulation occurs prior to the final mixer 30.

In addition, since it is the final mixer 30 that eliminates all frequencies (in the lower sideband) and changes the phase shift between the frequencies in the inputs 28 and 36 to an output voltage, it is correct to say that partial demodulation occurs in the final mixer 30.

Further, it is correct to say that a portion of the demodulation occurs (in the frequency converter 84) prior to the final mixer 30, and another portion of the demodulation occurs in the final mixer 30. Or, it is correct to say that this other portion of the demodulation occurs prior to the output 38 of the final mixer 30.

While all technical aspects of the present invention are not fully understood, tests have been conducted with a receiver built according to the principles outlined herein, with the bandwidth of the predetection filter decreased to one-fourth of the required bandwidth as determined by Carson's rule. With the bandwidth reduced by 75 percent, there was no loss of the modulation signal, and there was a measured increase in sensitivity of more than 3 dB.

Referring now to FIG. 5, in a second preferred embodiment of the present invention, a signal processing apparatus, or a receiver, 102 for processing angularly modulated signals includes all of the components named and described for the signal processing apparatus 82 of FIG. 4, except that a phase detector 104, having inputs 106 and 108, and having an output 110, replaces the final mixer 30. Preferably, the phase detector 104 is of the type manufactured by Mini Circuits of Brooklyn, N.Y., under the part number LPD-1.

The use of the phase detector 104 is preferred over the use of the final mixer 30 because of increased output voltage. However, since both mixers and phase detectors function in accordance with the same principles, and since they are often interchangeable, in the present patent application, the term mixer is used generically to refer to any device, such as a mixer or a phase detector, that performs the phase-comparing operation described above.

Referring now to FIG. 6, in a third embodiment of the present invention, a signal processing apparatus, or a receiver, 112 includes the components as shown and described in conjunction with the signal processing apparatus of FIG. 5. In addition, the signal processing apparatus 112 includes the first mixer 18, the first local oscillator 20 and the IF amplifier/filter 26 of FIG. 1.

Therefore, the signal processing apparatus 112 of FIG. 6 is similar to a double conversion FM receiver, except that the signal processing apparatus 112 does not include either an amplifier/predetection filter or a demodulator after the final mixer, and except that the signal processing apparatus includes the frequency converter 84 in the place where a double conversion receiver includes the second mixer and second local oscillator.

In the signal processing apparatus 112, the filter of the IF amplifier/filter 26 must be of a bandwidth as calculated by Carson's rule. However, the bandwidth of the filter in the IF amplifier/filter 86 can be much narrower than that calculated by Carson's rule.

Referring now to FIG. 7, a signal processing apparatus, or receiver, 116 includes components as shown and described in conjunction with the signal processing apparatus 112 of FIG. 6, except that: the frequency converter 84 is positioned in the location of the first mixer 18 of FIG. 6, and the first mixer 18 is positioned in the location of the frequency converter 84 of FIG. 6. Further, in the FIG. 7 embodiment, either the filter of an IF amplifier/filter 118 or the filter of the IF amplifier/predetection filter 86 may have a reduced bandwidth, or both filters may have reduced bandwidths.

Referring now to FIG. 8, the components in a signal processing apparatus, or receiver, 122, are the same as the signal processing apparatus in the signal processing apparatus 82 of FIG. 4, except that a demodulation mixer 124 and a variable frequency oscillator, or voltage controlled oscillator, 126 are used for the frequency converter 84 of FIG. 4. The demodulation mixer 124 is interposed between the rf amplifier 14 and the IF amplifier/predetection filter 86 of FIG. 4, an output 128 of the variable frequency oscillator 126 is connected to an input 130 of the demodulation mixer 124, and an input 132 of the variable frequency oscillator 126 is connected to the feedback conductor 88.

The variable frequency oscillator may be of various types, as will be pointed out later. However, for the embodiment of FIG. 8, a voltage controlled oscillator is preferred, although a current controlled oscillator may be used.

Referring now to FIG. 9, in a signal processing apparatus, or receiver, 136, the components are the same as those shown and described in conjunction with the FIG. 8 embodiment except that a variable crystal oscillator 138, having an input 140 and an output 142, is used instead of the variable frequency oscillator 126 of FIG. 8.

Preferably, the variable crystal oscillator 138 is a voltage controlled crystal oscillator, although a current controlled variable crystal oscillator may be used.

Referring now to FIG. 10, in a signal processing apparatus, or receiver, 146, the components are the same as described in conjunction with FIG. 8, except that a D.C. modulated phase locked oscillator 148, having an input 150 and an output 152, is used in place of the variable frequency oscillator 126 of FIG. 8.

Referring now to FIG. 11, a prior-art FM receiver 156 includes an automatic frequency control (AFC) 158. All of the parts of the prior-art FM receiver 10 of FIG. 1 are included in the prior-art FM receiver 156 except for the first local oscillator 20. In place of the first local oscillator 20, the prior-art FM receiver 156 uses a voltage-controlled oscillator, or variable frequent oscillator, 160 having an input 162 and an output 164. The variable frequency oscillator 160 is connected to the demodulated output conductor 48 by a conductor 166, a resistor 168, and a conductor 170, and the conductor 166 is connected to ground by a capacitor 172.

In operation, the demodulated output varies the frequency of the voltage-controlled oscillator 160 as a function of the demodulated output in the demodulated output conductor 48, as a function of the gain reduction provided by the resistor 168, and with a predetermined reduction in response provided by the capacitor 172. The automatic frequency control 158 automatically compensates for frequency drift as a function of time. To achieve the desired response, typically, the resistor 168 has a resistance of one megohm, and typically, the capacitor 172 has a capacitance of one microfarad.

Referring now to FIG. 12 in another embodiment of the present invention, a signal processing apparatus, or a receiver, 178, includes most of the same parts as the prior-art FM receiver 156 of FIG. 11. including the demodulator 44. Preferably, the demodulator 44 is of the quadrature detector type.

One difference in the embodiment of FIG. 12 and the prior-art FM receiver of FIG. 11 is that the resistor 168 and the capacitor 172 are deleted. But, in some cases, the resistor 156 may be retained, or the resistance of the resistor 168 may be changed from that of the prior-art FM receiver 156 of FIG. 11.

A primary difference between the signal processing apparatus 178 of FIG. 12 and the prior-art FM receiver 156 of FIG. 11 is that the IF amplifier/predetection filter 42 of the prior-art receiver 156 is replaced by the IF amplifier/predetection filter 86 of FIG. 4.

More particularly, in the prior-art FM receiver 156 of FIG. 11, the bandwidth of the filter in the IF amplifier/predetection filter 42 must be at least as wide as that calculated by Carson's rule, if not wider, since Carson's rule yields results that may be somewhat too small to include all significant sidebands.

However, in all of applicants' receivers, including the signal processing apparatus 178 of FIG. 12, the required bandwidth of the one or more filters following the first mixer 18 is reduced because, as previously explained, partial demodulation occurs in a mixer, such as the first mixer 18, that precedes the final mixer 30.

Therefore, in the receiver 178 of FIG. 12, the bandwidth of the filter immediately following the first mixer 18, the filter following the final mixer 30, or both, can be reduced in bandwidth. More particularly, the IF amplifier/filter 26 of FIG. 11 is replaced by the IF amplifier/predetection filter 86 which has a narrower bandwidth than that of the filter in the IF amplifier/filter 26. Optionally, the IF amplifier/predetection filter 42 of FIG. 11 can be replaced by another IF amplifier/predetection filter 86 having a filter with a narrower bandwidth.

As discussed previously, this ability to reduce the required bandwidth of a filter below that calculated by Carson's rule, is important in that the noise input bandwidth of the receiver is reduced. Also as discussed previously, this ability to reduce the required bandwidth is made possible by modifying the preselected signal. That is, the preselected signal is modified by removing a portion of the frequency variations caused by angular modulation of the carrier frequency. Or, stated another way, this reduction in required bandwidth is achieved by partially demodulating the signal prior to entrance thereof into the final mixer 30.

To achieve this modifying of the preselected signal, the gain of a feedback loop 180, which includes a feedback conductor 182 and the frequency response of the variable frequency voltage controlled oscillator 160 is far greater than would ever be used to achieve automatic frequency control in FM receivers. That is, the rate of change in the voltage fed back from the demodulated output conductor 48, together with the gain of the voltage controlled oscillator 160 must cooperate to remove at least a portion of the modulation frequencies from the angularly modulated signal, as the angularly modulated signal is mixed in the first mixer 18 with the frequency of the voltage controlled oscillator 160.

Further, in order to achieve the advantages of the present invention, not only must the signal be partially demodulated before being filtered, but also the bandwidth of a predetection filter must be reduced. To achieve partial demodulation prior to the demodulator 44 in the manner described, but then to use a filter with a conventional bandwidth would omit one of the two essential functions in increasing the sensitivity of the receiver 178 of FIG. 12. That is, partial demodulation prior to the demodulator 44, combined with a filter with conventional bandwidth, equals a receiver with conventional sensitivity.

Therefore, even though the schematic diagram of the signal processing apparatus 178 is quite similar in appearance to that of the prior-art FM receiver 156 of FIG. 11, the signal processing apparatus 178 differs in two critical aspects from prior-art FM receivers: 1) the frequency response of the feedback loop 180 is such that a portion of the frequency variations caused by modulation are removed before the preselected signal arrives at the demodulator 44, thereby allowing the use of a filter with a narrower bandwidth; and 2) the bandwidth of the filter in the IF amplifier/ predetection filter 86 is narrower than the required bandwidth as calculated by Carson's rule.

While, in the present invention, partial demodulation occurs prior to the final mixer 30, and while a demodulator, such as the demodulator 44 is not necessary, and although the theories of operation are not fully understood, as illustrated in FIG. 12, the present invention will function with a demodulator included.

More particularly, a commercially available FM receiver, which included a demodulator 44 of the quadrature detector type, was tested in accordance with the schematic of FIG. 12. This receiver received signals in the 500 MHz range, the maximum deviation of the modulation frequency was 300 kHz, and the maximum modulation frequency was 100 kHz.

The required bandwidth, as calculated by Carson's rule was 800 kHz, and the bandwidth of the filter in the IF amplifier/predetection filter was reduced to 200 kHz, or 25 percent of the required bandwidth as calculated by Carson's rule.

Tests showed a gain of more than 3 dB which, considering the reduction in bandwidth of the predetection filter, was to be expected. Therefore, the present invention yields substantial improvements in sensitivity when a demodulator is used after the final mixer, such as the receiver 178 of FIG. 12, as well as yielding substantial improvement in sensitivity when the demodulator is omitted, as taught in the receivers 82, 102, 112, 116, 122, 136, 178, and 146 of FIGS. 4–10.

Referring now to FIG. 13, a signal processing apparatus 188 includes all of the parts of the FIG. 12 embodiment of the present invention. In addition, resistors 190 and 192 function as a voltage divider, and a capacitor 194 retards changes in the voltage changes effected by the resistor 192.

In operation, the resistor 192 and the capacitor 194 cooperate to provide automatic frequency control, while voltages delivered directly to the voltage controlled oscillator 160 by the resistor 190 provide the demodulating function which has been described for the embodiment of FIG. 12.

By considering the receivers, 82, 122, 136, and 146 of FIGS. 4 and 8–10, respectively, and the discussions included therewith, it can be seen that any variable frequency oscillator can be used to achieve the increased sensitivity of receivers for angularly modulated signals. That is, the variable frequency oscillator 126 may be of either voltage controlled or current types, a variable crystal oscillator 138 of either voltage controlled or crystal controlled types, a D.C. modulated phase locked oscillator 148 of any type.

Therefore, in the claims, a variable frequency oscillator 126 includes any device that produces a controllable variable frequency, whether or not it be crystal controlled, and whether it be voltage controlled and current controlled. Or the variable frequency oscillator 126 may be any other device that performs the functions described herein. Further, the frequency converter 84 may include a demodulation mixer 124 and a variable frequency oscillator 126, or any other device, or combination of components that perform the functions described herein.

The receivers of FIGS. 4–10, 12, and 13 can be characterized by the method steps of: 1) reducing the required predetection bandwidth by modifying a preselected signal; and 2) reducing the bandwidth of the filtering step. That is, the frequency converter removes at least a portion of the frequency variations that are caused by either frequency modulation or phase modulation, thereby allowing the use of the IF amplifier/predetection filter 86 with a bandwidth lower than required by conventional receivers.

And, the receiver of the present invention can be characterized by the methods steps of: 1) partially demodulating a preselected signal; and 2) mixing the partially demodulated signal with another signal. That is, the preselected signal is partially demodulated by the frequency converter, and a mixing step follows this partial demodulating step.

Also, the receiver of FIGS. 4–10, 12, and 13 are characterized by the method steps of: 1) partially demodulating the angularly modulated signal prior to the final mixer; and 2) partially demodulating the angularly modulated signal in the final mixer. In addition, the patentable distinctions of the receivers of the present invention are seen in variations of these statements which are either explicitly or implicitly included in the descriptions included above.

In addition, the receivers of FIGS. 4–10, 12, and 13 are characterized by the method steps of: 1) preselecting a modulated signal using the preselector 420; 2) reducing the preselected signal using the rf mixer 418 and the phase locked oscillator 200, 236, 310, 330, or 390; 3) mixing the reduced frequency in the final mixer 426 with a modifying frequency from the final local oscillator 428; 4) using the output from the mixer 426 to derive a frequency using the modulation oscillator 256; and 5) using the derived frequency to vary the output frequency of the phase locked oscillator 200, 236, 310, 330, or 390.

The method steps are further characterized by using the demodulated output to vary the phase locked frequency by modulating the forward path 204 separately from the feedback Path 206.

While in the embodiments of FIGS. 4–10, the receivers of the present invention are characterized as being built without a demodulator following the final mixer, the present invention also includes embodiments in which a demodulator is used following the final mixer.

However, whether or not a demodulator is used following the final mixer, the present invention is characterized as noted above.

Further, all of the radio receivers of the present invention utilize a signal derived from the final mixer 30, which is the demodulated output to control the frequency converter 84. In embodiments that do not include a demodulator 44 following the final mixer 30, this mixer-derived signal may be taken directly from the output 38 of the final mixer 30, or from some other component that follows the final mixer 30, such as a filter (not shown) or an integrator, (not shown). However, in the embodiments that use the demodulator 44, the signal derived from the final mixer 30 may be taken from the demodulated output conductor 48 that follows the demodulator 44.

Referring now to FIG. 14, a D.C. modulated phase locked oscillator, or electrical device, 200 includes a phase locked loop 202 with both a forward path 204 and a feedback path 206. The forward path 204 includes a forward path conductor 208, and both an integrator 210 and a variable frequency oscillator, or voltage controlled oscillator, 212 that are interposed into the forward path conductor 208. The voltage controlled oscillator 212 includes both a control input 214 and an output 216; and connections in the forward path 204 include the control input 214 of the voltage controlled oscillator 212 being connected to the integrator 210 by the forward path conductor 208.

Also, the D.C. modulated phase locked oscillator 200 includes a crystal controlled reference oscillator, or reference frequency oscillator, 218 and a phase detector, or comparator, 220. An input 222 of the phase detector 220 connected to the crystal controlled reference oscillator 218, an output 224 of the phase detector 220 is connected to the forward path 204, and an input 228 of the phase detector 220 is connected to the feedback path 206 by a feedback conductor 226.

The output 216 of the variable frequency oscillator 212 is connected to an output conductor 230; and the output conductor 230 is connected to the feedback conductor 226. Thus, the output conductor 230 feeds back the phase locked output frequency of the variable frequency oscillator 212 as a feedback signal through the feedback conductor 226 to the input 228 of the phase detector 220. The phase detector 220 performs a time comparison between the leading edge of the phase of the feedback signal and the leading edge of the reference frequency that is supplied by the crystal controlled reference oscillator 218, and supplies this difference to the integrator 210.

The integrator 210 then controls the frequency of the voltage controlled oscillator 212 by supplying voltages thereto that are in accordance with integrated time differences between the leading edges of the phases of the feedback signal and the reference frequency. The effect is that the frequency of the output is phase locked to the frequency of the crystal controlled reference oscillator 218.

When a prescaling divider 232 is included in the circuitry of FIG. 14, but a dual modulus divider 234 is omitted, the output is divided by some number, perhaps sixteen, so that a feedback signal, having generally the form of a square wave, is produced whose frequency is lower than that of the output. This reduction in the frequency of the feedback signal allows the use of the crystal controlled reference oscillator 218 having a frequency that is less, in this example one-sixteenth, of the output.

In operation, assuming a dividing ratio of sixteen to one, a reduction in frequency of one cycle in the feedback path 206 requires an increase in frequency of sixteen Hertz in the output conductor 230 to phase lock the feedback path 206 to the crystal controlled reference frequency.

When the prescaling divider 232 is omitted from the schematic of FIG. 14, but the dual modulus divider 234 is included, the output frequency is divided, selectively, by two different dividing ratios, such as 40 and 41.

By using the dual modulus divider 234, the frequency of the output can be channelized, and yet the frequency of the output will be closely controlled by the crystal controlled reference frequency, thereby avoiding frequency drift in the output, except for the small drift of the crystal (not shown) in the crystal controlled reference oscillator 218.

Referring now to FIG. 15, an electrical device, or D.C. modulated phase locked oscillator, 236, is constructed using an integrated chip 238. Preferably, the integrated chip 238 is of the type built by Motorola which is numbered 45152 by the manufacturer.

The integrated chip 238 includes a reference oscillator 240 that cooperates with a crystal 242 to form the crystal controlled reference oscillator 218 of FIG. 14; and the integrated chip 238 also includes the phase detector 220 of FIG. 14. The integrated chip 238 further includes a variable modulus divider 244 that controls the number of times that the dual modulus divider 234 divides by the lower dividing ratio, and divides by the higher dividing ratio; and the integrated chip 238 includes a modulus controller 246 that controls the change from the lower dividing ratio to the higher dividing ratio to correspond to completion of any given dividing step.

In the FIG. 15 embodiment, the integrator 210 of FIG. 14 consists, in simplified form, of an operational amplifier 248 and a capacitor 250.

Channelization of the output of the voltage controlled oscillator 212 by the dual modulus divider 234 is accomplished as shown in the following example.

To channelize a transmitter starting at 400 MHz with channel steps of 100 kHz: the dual modulus divider 234, with dividing ratios of 40 and 41, divides the 400 MHz output by 40 for 100 times; and a frequency of 100 kHz is fed back to the phase detector 220. With the reference oscillator 240 having a reference frequency of 100 kHz, the frequency of the voltage controlled oscillator 212 will be adjusted until the output frequency in the output conductor 230 is equal to the product of 40 times 100, times the reference frequency of the reference oscillator 240, or 40×100×100 kHz=400 MHz.

To achieve the first channelized frequency above 400 MHz, an N counter of the integrated chip 238 of FIG. 15 is set to 99 so that the dual modulus divider 234 divides by 40 for 99 times; and an A counter is set to divide by 41 once.

When the dual modulus divider 234 divides the 400 MHz by 40 for 99 times, and by 41 for one time, for the phase locked loop 202 to phase lock, the phase detector 220 and the integrator 210 must increase the frequency of the voltage controlled oscillator 212 to be equal to ×100 kHz, or 400.1 MHz.

Therefore, reducing the number of times that the dual modulus divider 284 divides by 40, and equally increasing the number of times that the dual modulus divider 234 divides by 41, results in channelization in steps of 100 kHz.

While a reference frequency of 100 kHz has been used in the above examples for ease of computation, in a preferred embodiment a reference frequency of 31,250 Hertz is used.

The electrical device 200 of FIG. 14 further includes a synchronizer 254 and a variable frequency oscillator, or voltage controlled oscillator, or modulation oscillator or source of modulation frequencies, 256 which will be referred to herein as a modulation oscillator, and which preferably is an audio oscillator.

In operation, the modulation oscillator 256 and the synchronizer 254 cooperate to control the dual modulus divider 234, such that for each cycle of the modulation oscillator 256, the dual modulus divider 234 divides by the higher dividing ratio.

If the dual modulus divider 234 has dividing ratios of 40 and 41, and if the modulation oscillator 256 has an output frequency of 100 Hertz, then the dual modulus divider 234 will divide the feedback signal in the feedback conductor 226 by 40, except for 100 times in any given second; and the dual modulus divider 234 will divide the feedback signal by 41 for 100 times each second.

Each time the dual modulus divider 234 divides by the higher dividing ratio, one pulse will be removed from the feedback path 206, and the phase detector 220 will cooperate with the integrator 210 and the voltage controlled oscillator 212 to increase the output frequency by one cycle. Or, as in the example of a modulation oscillator 256 operating at 100

Hertz, 100 pulses will be removed from the feedback path 206 each second; and the output frequency in the output conductor 230 will be increased by 100 Hertz.

Since the modulation oscillator 256 is of the voltage controlled type and is D.C. modulated, and since the phase detector 220 and the integrator 210 cooperate to phase lock the feedback signal to the crystal controlled reference frequency, the output frequency must increase to keep the loop 202 phase locked, and the result is that the output frequency is D.C. modulated.

Since the output frequency is not only D.C. modulated, but also is crystal referenced, the present invention provides means for producing a crystal referenced output that is D.C. frequency modulated.

The D.C. frequency modulated output, being now crystal referenced, has the inherent frequency stability of a crystal; and, since the frequency of the modulation oscillator 256 is quite low, the frequency drift of the modulation oscillator 256, being a function of frequency, is also quite low. Therefore, the combined frequency drift of the crystal controlled reference oscillator 218 and the modulation oscillator 256 is extremely low.

Continuing to refer to FIG. 14, the synchronizer 254 holds a cycle received from the modulation oscillator 256 until it receives a division completion signal from a conductor 258 that connects the dual modulus divider 234 to the synchronizer 254. Then the synchronizer 254 delivers a modulus control signal to a modulus control conductor 260 that changes the dividing ratio of the dual modulus divider 234 from the lower dividing ratio to the higher dividing ratio.

Continuing to refer to FIG. 14, the embodiment of FIG. 14 includes a summing resistor 262, a summing resistor 264, a modulation conductor 266, and a modulation conductor 268. The summing resistor 262 is interposed into the forward path conductor 208; and the summing resistor 264 is interposed into the modulation conductor 268.

Therefore, both the forward path 204 and the feedback path 206 are D.C. modulated. That is, both the modulation oscillator 256 and the voltage controlled oscillator 212 are D.C. modulated.

In operation, the modulation conductor 266 conducts a D.C. modulation signal to the modulation oscillator 256; and the modulation conductor 268 conducts the modulation signal to the voltage controlled oscillator 212 through the summing resistor 264.

If the feedback path 206 were not modulated so that only the modulation signal of the modulation conductor 268 were connected to the voltage controlled oscillator 212, the phase locking of the phase locked loop 202 would cancel the frequency modulation of the output. Therefore, the frequency of the output could be A.C. modulated only, and then only if the modulation frequency were higher than the natural frequency of the phase locked loop 202.

If only the feedback path 206 is modulated, D.C. frequency modulation of the output is achieved, but the frequency response is limited by the natural frequency of the phase locked loop 202.

Then, to achieve frequency modulation of the output, the phase detector 220 must sense the difference in the frequency between the feedback path 206 and the frequency of the crystal controlled reference oscillator 218, the integrator 210 must integrate the output of the phase detector 220, the frequency of the voltage controlled oscillator 212 must be changed in accordance with the integrated output, and the phase detector 220 must phase lock the feedback path 206 to the reference frequency of the crystal controlled reference oscillator 218.

However, in the embodiments of FIGS. 14 and 15, both the forward path 204 and the feedback path 206 are modulated substantially simultaneously, thereby achieving not only D.C. modulation of the output, but also essentially unlimited frequency response.

The inclusion of both the prescaling divider 232 and the dual modulus divider 234 in the embodiments of FIGS. 14 and 15 decreases the required frequency of the crystal controlled reference oscillator 218, and decreases the required frequency of the modulation oscillator 256. While reducing the required frequency of the modulation oscillator 256 is advantageous in that the frequency of the modulation oscillator 256 is lowered, and the frequency drift thereof is reduced, the phase locking time is increased as the feedback frequency is decreased.

It should be understood that a phase locking oscillator 270 of the FIG. 14 embodiment includes the phase locked loop 202 with both the forward path 204 and the feedback path 206, the voltage controlled oscillator 212 and the integrator 210 in the forward path 204, the prescaling divider 232 in the feedback path 206, the crystal controlled reference oscillator 218, and the phase detector 220 that is connected to the crystal controlled reference oscillator 218 and to both the forward path 204 and the feedback path 206.

Further, it should be understood that a D.C. modulator 272 of the FIG. 1 embodiment includes the dual modulus divider 234 and the synchronizer 254 both of which are operatively connected to the feedback path 206; and the D.C. modulator 272 further includes the summing resistors, 262 and 264, and the modulation conductors, 266 and 268.

Referring again to FIG. 15, the electrical device 236 provides substantially simultaneous modulation of both the forward path 204 and the feedback path 206, also as described for the FIG. 14 embodiment.

In addition, the electrical device 236 of FIG. 15 provides channelization of the output frequency, as previously described, as well as D.C. modulation of the output frequency.

Both D.C. modulation and channelization of the output frequency are achieved by controlling the dual modulus divider 234 by two separate means.

More particularly, channelization is achieved by controlling the dual modulus divider 234 by the variable modulus divider 244 and the modulus controller 246 in the integrated chip 238; and D.C. modulation is achieved by controlling the dual modulus divider 234 by the modulation oscillator 256.

The function of the synchronizer 254 of FIG. 14 is achieved in FIG. 15 by a synchronizer 276 which consists of first and second flip-flops, or first and second logic elements, 278 and 280, that provide logic functions, and an OR gate 282.

When a cycle, or pulse removing signal, is delivered to a clock terminal 284 of the flip-flop 278 by the modulation oscillator 256, an output terminal, or Q terminal, 286 is energized, thereby energizing an input terminal, or D terminal, 288 of the flip-flop 280. The pulse removing signal from the modulation oscillator 256 is held by the flip-flop 278 until the flip-flop 278 is reset by a signal to a reset terminal 290.

Assuming that the dual modulus divider 234 has been dividing the feedback signal in the feedback path 206 by one or the other of the dividing ratios, when the dual modulus divider 234 has finished performing a dividing operation which is, done to achieve channelization, a pulse in a conductor 292 is directed to a clock terminal 294 of the flip-flop 280 and to the modulus controller 246 of the integrated chip 238.

With energizing of the clock terminal 294, a modulus control signal is sent from a Q terminal, or output terminal, 296 of the flip-flop 280 to the dual modulus divider 234 via the OR gate 282 and a modulus control conductor 298, thereby changing the dividing ratio of the dual modulus divider 234 from the lower dividing ratio to the higher dividing ratio for one dividing cycle, and thereby removing one pulse from the feedback path 206.

Completion of the next dividing cycle sends a signal in the conductor 292 to the modulus controller 246; and the modulus controller 246 sends a reset signal to a reset terminal 300 of the flip-flop 280 via a modulus control conductor 302, and sends a modulus control signal to the dual modulus divider 234 via the modulus control conductor 302, the OR gate 282, and the modulus control conductor 298.

Also, as a signal is sent from the Q terminal 296 of the flip-flop 280 to the OR gate 282 and to the dual modulus divider 234, a reset signal is sent from the Q terminal 296 of the flip-flop 280 to the reset terminal 290 of the flip-flop 278, thereby resetting the flip-flop 278.

Thus, it can be seen that the synchronizer 276, consisting of the flip-flops, 278 and 280, and the OR gate 282, cooperates with the modulus controller 246 to prevent simultaneous control of the dual modulus divider 234 by the variable modulus divider 244, which provides channelization of the output frequency, and simultaneous control of the dual modulus divider 234 by the modulation oscillator 256 which provides D.C. modulation of the output frequency of the electrical device 236.

It should be understood that, in the FIG. 15 embodiment, the electrical device, or D.C. modulated phase locked oscillator, 236 includes a phase locking oscillator 304 for producing a phase locked output, and a D.C. modulator 306 for D.C. modulating the output frequency of the phase locking oscillator 304.

Also, it should be understood that the phase locking oscillator 304 of the FIG. 15 embodiment includes the phase locked loop 202 with both the forward path 204 and the feedback path 206, the voltage controlled oscillator 212, the operational amplifier 248 and the capacitor 250 which cooperate to provide the integrator 210, the prescaling divider 232, the crystal 242, and the integrated chip 238.

The portions of the integrated chip 238 that are included in the phase locking oscillator 304 are: the reference oscillator 240 which cooperates with the crystal 242 to provide the crystal controlled reference oscillator 218, the phase detector 220, the variable modulus divider 244, and the modulus controller 246.

Finally, it should be understood that the D.C. modulator 306 of the FIG. 15 embodiment includes the dual modulus divider 234, and a synchronizer 276 consisting of the flip-flops, 278 and 280, and the OR gate 282, all of which are operatively connected to the feedback path 206. The D.C. modulator 306 of FIG. 15 also includes the summing resistors, 262 and 264, and the modulation conductors, 266 and 268.

As stated above, the dual modulus divider 234 is a part of the D.C. modulator 306; but also, the dual modulus divider 234 is a part of the phase locking oscillator 304 as the dual modulus divider 234 cooperates with the variable modulus divider 244 and the modulus controller 246 to provide channelization of the phase locking oscillator 304.

Referring now to FIG. 16, an electrical device, or D.C. modulated phase locked oscillator, 310 includes components generally as named, numbered, and described in conjunction with the embodiment of FIG. 15.

However, the electrical device 310 of FIG. 16 does not include the OR gate 282 of the FIG. 15 embodiment. Instead, the electrical device 310 of FIG. 16 includes a resistor 312 and a diode 314.

In operation, when the flip-flop 280 is in the unclocked state, the diode 314 blocks current flow to the output terminal 296; and the circuitry functions as described for FIG. 15.

However, when the modulation oscillator 256 produces a pulse, the flip-flop 278 is clocked, producing a high at the output terminal 286 and energizing the input terminal 288 of the flip-flop 280. Then, when the dual modulus divider 234 finishes a division by one of the dual dividing ratios, it delivers a pulse to the conductor 292, clocking the flip-flop 280.

With the flip-flop 280 clocked, a high is produced at the output terminal 296 of the flip-flop 280; and this high at the output terminal 296 is used to reset flip-flop 278 in preparation for another pulse from the modulation oscillator 256.

In addition, this high from the output terminal 296 is delivered, via the diode 314, to a conductor 316, making the conductor 316 high. With the output terminal 296 connected to the conductor 316 through the diode 314, and with the resistor 312 being interposed between the conductors 316 and 292, the conductor 316 is kept high as the conductor 292 goes low between pulses.

The result is, by preventing a low in the conductor 316 between two pulses delivered to the conductor 292 by the dual modulus divider 234, two pulses are combined into one; and in effect, one pulse is removed from the feedback path 206 in the conductor 316.

Removing one pulse from the conductor 316 effectively removes a number of pulses from the feedback path 206 that is equal to the dividing ratio of the prescaling divider 232 times the lower dividing ratio of the dual modulus divider 234.

For instance, if the prescaling divider 232 has a dividing ratio of 16, and if the lower dividing ratio of the dual modulus divider 234 is 20, then each pulse of the modulation oscillator 256 removes 16 times 20, or 320 pulses from the feedback path 206. Therefore, to increase the output of the voltage controlled oscillator 212 by 10 MHz, the required frequency of the modulation oscillator 256 would be 31,250 Hertz.

Notice that in this manner extremely wide frequency deviations can be achieved. This is, of course, at the expense of increased drift since the modulation oscillator drift is multiplied by the ratio shown above, that is, 320. In the example shown, a typical drift of 30 kHz at the output could be caused by the drift of the modulation oscillator 256 when multiplied by 320. This drift is still well within the drift allowed from transmitters which would use this wider deviation capability.

As previously noted, since the frequency drift of a voltage controlled oscillator, such as the modulation oscillator 256, is smaller for lower frequencies, the total drift of the D.C. modulated phase locked oscillator 310 as described herein is less when a plurality of pulses are removed from the feedback path 206 for each cycle of the modulation oscillator 256, and the frequency of the modulation oscillator 256 is reduced.

The pulse removal, or pulse combining, as described in conjunction with FIG. 16, must be prohibited when the dual modulus divider 234 is in the higher mode to prevent an incorrect output frequency. To prevent the pulse removing function from removing a pulse resulting from division at the higher dividing ratio, the modulus control conductor 302 is connected to the flip-flop 280 in addition to being connected to the dual modulus divider 234. This connection of the modulus control conductor 302 to the flip-flop 280 provides synchronization of the modulating and dividing functions as described in conjunction with the embodiment of FIG. 15.

It should be understood that the electrical device 310 of FIG. 16 includes a phase locking oscillator 318 and a D.C. modulator 320. The phase locking oscillator 318 includes the voltage controlled oscillator 212, the crystal controlled reference oscillator 218, the phase detector 220, the variable modulus divider 244, and the modulus controller 246. The D.C. modulator 320 includes the flip-flops 278 and 280, the resistor 312, the diode 314, and the resistors 262 and 264. A synchronizer 322 of the FIG. 16 embodiment includes the flip-flops, 278 and 280, the resistor 312, and the diode 314. The synchronizer 322 cooperates with the modulus control conductor 302 to provide the synchronizing function, as described previously.

Referring again to FIG. 15, if the dual modulus divider 234 were set so that the normal state were to divide at the higher dividing ratio, rather than normally to divide at the lower dividing ratio, then, in effect, one pulse would be added to the feedback path 206, rather than removed therefrom.

That is, if the dual modulus divider 234 were dividing by a dividing ratio of 21, and then dividing at the ratio of 20 once per second, the frequency in the feedback path 206, as supplied to the phase detector 220, would be increased by one pulse per second; and the phase detector 220 and the integrator 210 would cooperate with the voltage controlled oscillator 212 to reduce the output frequency by one Hertz.

Of course, to obtain an increase in the output frequency as a function of the frequency of the modulation oscillator 256, with the dividing ratios inverted as noted above, would require providing an inverted D.C. modulation voltage to the modulation oscillator 256, while continuing to supply an uninverted D.C. modulation voltage to the resistor 264.

It is important to notice that D.C. modulation of a phase locked loop is achieved in the present invention by either removing pulses from the feedback path 206 or adding pulses to the feedback path 206.

Also, removal of pulses is achieved by preventing a low from appearing in the conductor 316 of FIG. 16 by placing a high in the conductor 316 from the output terminal 296, through the diode 314, and into the conductor 316, while isolating the high in the conductor 316 from a low in the conductor 292 by the resistor 312 for one cycle.

Or, stated more broadly, the use of the resistor 312 and the diode 314 prevents a change in the signal level in the feedback path 206.

In FIG. 14, the synchronizer 254 is shown symbolically. In the FIG. 15 embodiment, the synchronizer 276 includes the flip-flops 278 and 280, and the OR gate 282. And, in the FIG. 16 embodiment, the synchronizer 322 includes the flip-flops 278 and 280, the resistor 312, and the diode 314.

Referring again to FIG. 14, the following should be observed: The output 224 of the phase detector 220 controls the integrator 210, the integrator 210 controls the voltage controlled oscillator 212, and the voltage controlled oscillator 212 produces the output frequency in the output conductor 230. Because of this forward progression of control, as opposed to feedback of the output signal from the output conductor 230 to the input 228 of the phase detector 220, as used in the appended claims, the forward path 204 of the phase locked loop 202 includes: the phase detector 220, the integrator 210, the forward path conductor 208, the voltage controlled oscillator 212, and the output conductor 230.

In like manner, since the output signal feeds back from the output conductor 230 to the input 228 of the phase detector 220 as a feedback signal, as used in the appended claims, the feedback path 206 includes the feedback conductor 226 and the dual modulus divider 234.

Since the phase detector 220 provides an output which is a function of the difference between the phase angles of the feedback signal to the input 228 and the reference frequency in the input 222, the phase detector 220 is a part of the forward path 204.

It follows that the electrical components of the various embodiments of the present invention can be understood to be a part of the forward path 204, to be a part of the feedback path 206, or to be a part of neither one, in accordance with the flow of signal from the phase detector 220 toward the output conductor 230, or the flow of signal from the output conductor 230 back to the phase detector 220.

For instance, it is evident that the prescaling divider 232 of FIG. 14 is in the feedback path 206. In like manner, referring to FIG. 15, the prescaling divider 232, the dual modulus divider 234, and the A and N counters of the variable modulus divider 244 of the integrated chip 238 are a part of the feedback path 206. However, it is obvious that the reference oscillator 240 of the integrated chip 238 is not a part of the forward path 204, nor a part of the feedback path 206; because it is outside the phase locked loop 202.

Further, it should be recognized that each of the electrical devices 200, 236, and 310 of FIGS. 14–16, includes a phase locking oscillator 270, 304, or 318, respectively, for producing a phase locked output; and each of the electrical devices 200, 236, and 310 of FIGS. 14–16, includes a D.C. modulator 272, 306, or 320, respectively, for D.C. modulating the output of the phase locking oscillator 270, 304, or 318, respectively.

Referring now to FIG. 17, an electrical device, or D.C. modulated phase locked oscillator, 330 includes a phase locking oscillator 332 and a D.C. modulator 334. The phase locking oscillator 332 includes components generally as named, numbered, and described in conjunction with the embodiment of FIG. 15.

However, the phase locking oscillator 332 of FIG. 17 does not include the prescaling divider 232, the dual modulus divider 234, or the integrated chip 238. Instead, the phase locking oscillator 332 includes an integrated chip 336.

The integrated chip 336 includes the reference oscillator 240, the phase detector 220, and the variable modulus divider 244, all of which function as described for the integrated chip 238. The integrated chip 336 is of a type manufactured by Motorola under the number 45151.

The D.C. modulator 334 includes the variable modulus divider 244 of the integrated chip 336, a quadrature signal generator 338 that includes a flip-flop 340, a flip-flop 342, filters 344 and 346, and a quadrature phase shift keying (QPSK) mixer 348 which preferably is part number PMQPW-250, manufactured by Mini-Circuits of Brooklyn N.Y.

For the purposes of describing the operation of the flip-flops 340 and 342, initial conditions are assumed as follows: a low at three terminals, namely a Q terminal, or output terminal, 350 of the flip-flop 342, a D terminal, or input terminal, 352 of the flip-flop 340, and a Q terminal, or output terminal, 354; and a high at a NOT-Q terminal, or output terminal, 356 of the flip-flop 340, and a D terminal, or input terminal, 358 of the flip-flop 342 which is connected to the NOT-Q terminal 356 by a conductor 360. Further, a low is assumed on clock terminals 362 and 364 of flip-flops 340 and 342, respectively.

The operation of the flip-flops 340 and 342 can best be understood by considering the states of the various ones of the terminals, 350, 352, 354, 356, and 358 of the flip-flops 340 and 342 prior to, and immediately following the rising edge of, each cycle from the modulation oscillator 256.

Assuming the initial states of the terminals 350, 354, 356, and 358 as noted above, where "0" is a low and "1" is a high, then the leading edge of a particular cycle from the modulation oscillator 256, applied to clock terminals 362 and 364, results in the original states being changed, or remaining the same, as follows:

TABLE 1

| Prior to and Subsequent to 1st Cycle | |
| --- | --- |
| Flip-flop 342 | |
| D terminal 358 | "1" → "1" |
| Q terminal 350 | "0" → "1" |
| Flip-flop 340 | |
| D terminal 352 | "0" → "1" |
| Q terminal 354 | "0" → "0" |
| NOT-Q terminal 356 | "1" → "1" |

TABLE 2

| Prior to and Subsequent to 2nd Cycle | |
| --- | --- |
| Flip-flop 342 | |
| D terminal 358 | "1" → "0" |
| Q terminal 350 | "0" → "1" |
| Flip-flop 340 | |
| D terminal 352 | "1" → "1" |
| Q terminal 354 | "0" → "1" |
| NOT-Q terminal 356 | "1" → "0" |

TABLE 3

| Prior to and Subsequent to 3rd Cycle | |
| --- | --- |
| Flip-flop 342 | |
| D terminal 358 | "0" → "0" |
| Q terminal 350 | "1" → "0" |
| Flip-flop 340 | |
| D terminal 352 | "1" → "0" |
| Q terminal 354 | "1" → "1" |
| NOT-Q terminal 356 | "0" → "0" |

TABLE 4

| Prior to and Subsequent to 4th Cycle | |
| --- | --- |
| Flip-flop 342 | |
| D terminal 358 | "0" → "1" |

TABLE 4-continued

| Prior to and Subsequent to 4th Cycle | |
| --- | --- |
| Q terminal 350 | "0" → "0" |
| Flip-flop 340 | |
| D terminal 352 | "0" → "0" |
| Q terminal 354 | "1" → "0" |
| NOT-Q terminal 356 | "0" → "1" |

From a study of the tables shown above, taken together with the schematic drawing of FIG. 17, it can be seen that one pulse is supplied to the filter 344, and to a first quadrature input terminal 366 of the QPSK mixer 348, when the leading edge of the first cycle is received from the modulation oscillator 256.

Also, from the tables shown above, it can be seen that a second pulse is supplied through the filter 346 and to a second quadrature input terminal 368 of the QPSK mixer 348 when the leading edge of the second cycle is received from the modulation oscillator 356.

Further, it can be seen from the tables shown above that these pulses are supplied to the filters 344 and 346, and to the QPSK mixer 348, only once for each four cycles of the modulation oscillator 256, and that these two pulses are one cycle apart, the first occurring at the first cycle of the modulation oscillator 256, and the second occurring at the second cycle of the modulation oscillator 256.

Thus, the flip-flops, 340 and 342, cooperate to divide the frequency of the modulation oscillator 256 by four. Further, since the two pulses from the flip-flops, 340 and 342, are separated by one cycle of the modulation oscillator 256, they are phase shifted by 90 degrees, and the flip-flops, 340 and 342, serve as the quadrature signal generator 338.

Referring now to FIGS. 18a–18c, and to the preceding description that follows Tables 1–4: FIG. 18a is a graph of a modulation frequency 370 of the modulation oscillator 256 that has a period 372; FIG. 18b is a graph of a first square wave 374 that is developed at the Q terminal 350 of the flip-flop 342 in response to the modulation frequency, that has a period 376, and that is delivered through the filter 344 to the first quadrature input terminal 366 of the QPSK mixer 348; and FIG. 18c is a graph of a second square wave 378 that is developed at the Q terminal 354 of the flip-flop 340 in response to the modulation frequency, that has a period of 380, that is phase shifted from the first square wave 374, and that is delivered through the filter 346 to the second quadrature input terminal 368 of the QPSK mixer 348.

Thus, as seen in FIGS. 18a–18c, the flip-flops, 340 and 342, of the quadrature signal generator 338 provide first and second square waves, 374 and 378, whose periods, 376 and 380, extend for four of the periods 372 of the modulation frequency 370; and the second square wave 378 is shifted in time by one of the periods 372. Further, the frequencies of the first and second square waves, 374 and 378, are one-fourth of the frequency of the modulation frequency 370, and the first and second square waves. 374 and 378 are phase shifted 90 degrees from one another to provide quadrature frequencies.

Therefore, with the QPSK mixer 348 interposed into the feedback conductor 226, with a feedback input terminal 382 and a feedback output terminal 384 connected to the feedback conductor 226, when mixed with frequencies in the feedback path 206, the lower sideband frequency, which is the only sideband developed, is lower than the feedback frequency by one-fourth of the frequency of the modulation oscillator 256; and, to maintain phase locking, the voltage controlled oscillator 212 increases its frequency by one-fourth of the frequency of the modulation oscillator 256.

Referring now to FIG. 19, an electrical device, or D.C. modulated phase locked oscillator, 390 includes a phase locking oscillator 392 and a D.C. modulator 394. Generally speaking, the electrical device 390 includes components as named and numbered in conjunction with the FIG. 17 embodiment.

More particularly, the phase locking oscillator 392 includes the reference frequency oscillator 218, consisting of both the reference oscillator 240 and the crystal 242, that provides an input frequency, the phase detector, or comparator, 220, and the phase locked loop 202 that includes both the forward path 204 and the feedback path 206.

The forward path 204 includes the phase detector 220, the integrator 210, the modulation conductor 266, the variable frequency oscillator, or voltage controlled oscillator, 212, and the output conductor 230. The variable frequency oscillator 212 includes both the control input 214 and the output 216.

The feedback path 206 includes the feedback conductor 226, the prescaling divider 232, a feedback conductor 396, an AND gate 398, and the variable modulus divider 244.

The D.C. modulator 394 includes the modulation oscillator 256, the flip-flop 278, the flip-flop 340, and the AND gate 398. A synchronizer 400 includes the flip-flops, 278 and 340, and the AND gate 398. Optionally, for the purpose of D.C. modulating the forward path 204 substantially simultaneously to D.C. modulating the feedback path 206, the D.C. modulator 394 includes the summing resistors 262 and 264.

In operation, when the flip-flop 340 is in its unclocked state, the NOT-Q terminal 356 is high; and this high is applied to a gate 402 of the AND gate 398. Therefore, as pulses of the feedback frequency in the feedback conductor 396 are applied to a gate 404 of the AND gate 398, the feedback pulses proceed unhindered through the AND gate 398 to the variable modulus divider 244.

Now, it should be recognized that the feedback frequency in the feedback path 206 is much higher than the frequency of the modulation oscillator 256 and that the two frequencies are nonsynchronous. Therefore, many pulses of the feedback frequency may pass before the occurrence of a pulse from the modulation oscillator 256.

When the modulation oscillator 256 does produce a pulse, the rising edge of the pulse, as applied to the clock terminal 284, clocks the flip-flop 278 since the D input of the flip-flop 278 is maintained high by a constant voltage, as shown in FIG. 19. As the flip-flop 278 is clocked, its Q terminal, or output terminal, 286 goes high, thereby placing a high on the D terminal 352 of the flip-flop 340.

The next pulse of the feedback frequency in the feedback conductor 226 is applied to the clock terminal 362 of the flip-flop 340 and clocks the flip-flop 340, thereby making the NOT-Q terminal 356 low. With the low of the NOT-Q terminal 356 of the flip-flop 340 applied to the gate 402, that one pulse of the feedback frequency is prevented from going through the AND gate 398. Therefore, the AND gate 398 cooperates with the flip-flops, 278 and 340, to prevent a change in signal level in the feedback path 206 beyond the AND gate 398.

At the same time that the NOT-Q terminal 356 is made low by clocking of the clock terminal 362 by a pulse in the feedback path 206, this clocking of the flip-flop 340 makes the Q terminal 354 high. This high at the Q terminal 354 is applied to the reset terminal 290 of the flip-flop 278 as shown in FIG. 19. Thus, the flip-flop 278 is reset, making its Q terminal 286 low, making the D terminal 352 low, and resetting the flip-flop 340.

The result is that only one pulse is removed from the feedback conductor 396 for each pulse of the modulation oscillator 256, and then the flip-flop 278 remains unclocked until the next pulse from the modulation oscillator 256; the flip-flop 340 remains unclocked until the flip-flop 278 is clocked by the modulation oscillator 256; and pulses in the feedback path 206 pass through the AND gate 398 until the occurrence of both the next pulse of the modulation oscillator 256 and a subsequent pulse in the feedback conductor 226.

However, If the prescaling divider 232 divides the feedback frequency in the feedback conductor 226 by thirty, then thirty pulses are removed from the feedback conductor 226 for each cycle of the modulation oscillator 256; and the frequency of the variable frequency oscillator 212 must increase by thirty cycles for each cycle of the modulation oscillator 256.

As described above, the frequency in the feedback path 206 is changed as a function of the modulation frequencies of the modulation oscillator 256. Also, as described above, the synchronizer, 254, 276, 322, or 400, synchronizes the changing of the frequency of the pulses in the feedback path 206 with the pulses in the feedback path 206, whether these pulses are divided by a dual modulus divider 234, as in the embodiments of FIGS. 14, 15, and 16, or whether the frequency in the feedback path 206 is changed by other means, such as in the embodiments of FIGS. 17 or 19.

Therefore, by virtue of this synchronization, the frequency of the pulses in the feedback path 206 is changed, or modulated, by an exact mathematical function of the frequencies of the modulation oscillator 256. Further, since the phase locked loop 202 is phase locked to the feedback path 206 and to the reference oscillator 218 or 240, D.C. modulating of the feedback path 206 by an exact mathematical function of the modulation frequencies results in D.C. modulating the output of the voltage-controlled oscillator 212 by an exact mathematical function of the modulation frequencies.

In like manner, the QPSK mixer 348 provides synchronization in mixing the square waves 374 and 378 of the quadrature signal generator 338 with the frequency in the feedback path 206. Therefore, in the FIG. 17 embodiment also, the frequency of the pulses in the feedback path is changed, or modulated, by an exact mathematical function of the frequencies of the modulation oscillator 256. And this modulation of the feedback path 206, together with phase locking of the phase locked loop 202, results in the output of the variable frequency oscillator 212 being D.C. modulated by an exact mathematical function of the modulation frequencies.

Referring now to FIG. 20, a radio frequency receiver, or signal processing apparatus, 410 comprises an input stage 412, an IF stage 414, a demodulator, or processing means 416 that includes the IF stage 414, an rf mixer, or first mixer 418, the phase locking oscillator 304 of FIG. 15, and the D.C. modulator 306 also of FIG. 15.

The input stage 412 includes an rf preselector 420 and an rf amplifier 422; and the IF stage 414 includes an IF amplifier/predetection filter 424, a final mixer, or second mixer 426, and a final local oscillator 428.

More particularly, the input stage 412 is connected to a first input 430 of the rf mixer 418, the phase locking oscillator 304 is connected to a second input 432 of the rf mixer 418, and the IF amplifier/predetection filter 424 of the IF stage 414 is connected to an output 434 of the rf mixer 418.

In operation, the input stage 412 receives and amplifies an rf input signal that is frequency modulated; the phase locking oscillator 304 generates a phase locked signal, that is, a signal that is phase locked to a crystal controlled reference frequency; the amplified rf signal is mixed with the phase locked signal in the rf mixer 418 wherein the frequency modulated signal is partially demodulated; and the frequency modulated signal is also partially demodulated in the IF stage 414 to produce a demodulated output signal in an output conductor 436; and the D.C. modulator 306 uses the demodulated output signal in the output conductor 436 to D.C. modulate the phase locked signal of the phase locking oscillator 304.

The rf input signal may be in the 2200 to 2400 MHz range, the D.C. modulated phase locked oscillator 236 may have an output frequency in the range of 1700–1900 MHz, and the final local oscillator 428 may have a frequency of 500 MHz, However, these frequencies are given merely as an example. In actual practice, the input frequencies may be in any range of rf frequencies, or even in frequencies that are below the rf range, and that are connected to the radio frequency receiver 410 by other means, such as electrical connection or light waves.

Recurring to FIG. 20, it should be recognized that the signal processing apparatus 410 of FIG. 20 includes the electrical device 236 of FIG. 15.

More particularly, it should be recognized that the circuitry of the radio frequency receiver 410 includes the phase locking oscillator 304 and the D.C. modulator 306, both of FIG. 15.

Further, it should be recognized that each of the embodiments of FIGS. 14–17 and 19 includes a phase locking oscillator 270, 304, 318, 332, or 392, respectively, for producing a phase locked output; and each of the embodiments of FIGS. 14–17 and 19 includes a D.C. modulator 272, 306, 320, 334, or 394, respectively, for D.C. modulating the output of the phase locking oscillator 270, 304, 318, 332, or 392, respectively. Any of the D.C. modulated phase-locked oscillators of FIG. 14–17 and 19 can be used in the receiver of FIG. 20.

In summary, the present invention provides FM and PM receivers with increased sensitivity by: 1) reducing the required bandwidth of the predetection filter by modifying a preselected signal before it enters the final mixer; and 2) reducing the bandwidth of the predetection filter. This reduction in the required bandwidth is achieved by removing, prior to the final mixer, at least a portion of the frequency variations that are caused by either frequency modulation or phase modulation. Therefore, the receivers of FIGS. 4–10, 12, and 13 can be characterized by the methods steps of: 1) partially demodulating a preselected signal; and 2) mixing the partially demodulated signal with another signal.

Also, since the receiver of FIGS. 4–10, 12, and 13 partially demodulate the preselected signal in the final mixer, these receivers can be characterized by the method steps of: 1) partially demodulating the angularly modulated signal prior to the final mixer; and 2) partially demodulating the angularly modulated signal in the final mixer.

While the receivers of FIGS. 4–10 are built without a demodulator following the final mixer, the receivers of FIGS. 12 and 13 include a demodulator following the final mixer. However, whether or not a demodulator is used following the final mixer, the characterization statements included above, as well as other characterization statements apply to receivers with or without demodulators following the final mixer.

Further, all of the radio receivers of the present invention utilize a signal derived from the final mixer 30 to control the frequency converter 84. In embodiments that do not include a demodulator 44 following the final mixer 30, this mixer-derived signal may be taken directly from the output 38 of the final mixer 30, or from some other component that follows the final mixer 30, such as a filter (not shown) or an integrator (not shown). However, in the embodiments that use a demodulator 44, this signal derived from the final mixer 30 preferably is taken from the demodulated output conductor 48 that follows the demodulator 44.

Finally, each of the radio receivers of FIGS. 4–10, 12, and 13 include a frequency converter 84 that achieves partial demodulation ahead of the final mixer 30. That is, the frequency converter 84 provides a converting step in the method of processing angularly modulated signals. In the preferred embodiments, the frequency converter 84 includes a first mixer 18 and a variable frequency oscillator 126. The variable frequency oscillator 126 may be of any type in which an input 132 controls the frequency of an output 128. Variable frequency oscillators, as used in the present invention to achieve partial demodulation, include both voltage and current controlled oscillators, variable crystal oscillators 138 whether voltage or current controlled, and D.C. modulated phase-locked oscillators 148, including the D.C. modulated phase-locked oscillators of FIG. 14–19 or any other type.

For purposes of understanding the appended claims, the forward path 204 includes the phase detector 220, and extends from the phase detector 220 to the output 216 of the voltage controlled oscillator 212; and the feedback path 206 extends from the output 216 of the voltage controlled oscillator 212 to the input 228 of the phase detector 220.

In like manner, a frequency in the forward path 204 is a forward frequency, and a frequency in the feedback path 206 is a feedback frequency.

Each of the D.C. modulated phase locked oscillators 236, 310, 330, and 390 includes both the phase locking oscillator 270, 304, 318, 332, or 392 and the D.C. modulator 272, 306, 320, 334, or 394.

Further, each of Lite D.C. modulators 272, 306, 320, 334, and 394 includes frequency changing means 234, 264, 312, 348, and/or 398 for varying the phase locked output frequency as a function of a derived signal, or demodulated output, in the conductor 436. This change in frequency may be in either the feedback path 206 or the forward path 204, and the change in frequency may be achieved by one or more components as described herein.

For instance, the frequency in the feedback path 206 may be changed by such components as the dual modulus divider 234 of FIG. 15, the resistor 312 of FIG. 16, the QPSK mixer 348 of FIG. 17, or the AND gate 398 of FIG. 19. And the frequency in the forward path 204 may be changed by the resistor 264 of FIG. 15.

The signal processing apparatus 410 includes a closed loop 438: and the closed loop 438 includes the mixer 418, the IF amplifier/filter 424, the mixer 426, the conductor 436, a phase locking oscillator such as the phase locking oscillators 270, 304, 318, 332, and 392, and the output conductor 230 that completes the closed loop 438 by connecting to the mixer 418.

Therefore, in the present invention a second closed loop in the form of a phase locked oscillator, such as the phase locked oscillator 236, is interposed into the closed loop 438 of the signal processing apparatus 410. When the demodulated output is produced in the conductor 436, not only is the phase locking oscillator 304 phase locked, but also the closed loop 438 is phase locked by virtue of using the demodulated output in the conductor 436 as a demodulated output to modulate the phase locking oscillator 304, and of using the variable and phase locked output frequency of the phase locking oscillator 304 as an input frequency to the mixer 418.

In the preceding descriptions of the various embodiments, not every element, nor every part of every element, has been described in conjunction with a particular embodiment. The reader should understand that, where the same numbers are shown in various drawings, the elements, and parts thereof, are the same as like-numbered parts which are described in conjunction with any other embodiment.

While the present invention has been described with particular components, it should be understood that the scope of the present invention is to be determined by the terminology used in the claims, and by the functions recited therein, without regard to more specifically described components in the detailed description.

Further, while examples have been given for frequencies, it should be understood that the present invention will function as described, and is useful in the gigahertz range, in the megahertz range, in the kilohertz range, and below the kilohertz range. For this reason, frequency limiting terms, such as radio frequency, are not needed, nor included, in the claims.

While specific apparatus and method have been disclosed in the preceding description, and while part numbers have been inserted parenthetically into the claims to facilitate understanding of the claims, it should be understood that these specifics have been given for the purpose of disclosing the principles of the present invention and that many variations thereof will become apparent to those who are versed in the art. Therefore, the scope of the present invention is to be determined by the appended claims, and without any limitation by the part numbers inserted parenthetically in the claims.

Industrial Applicability

The present invention is applicable to relatively unsophisticated audio radios for receiving commercial broadcasts, receiving the audio portion of consumer video, personal FM communications, amateur radio, industrial radio uses that include audio, digital data, and video, and military communications that include audio, digital data, and video.

What is claimed is:

1. A method for processing angularly modulated signals that includes the steps of preselecting an angularly modulated signal, filtering said angularly modulated signal, mixing said angularly modulated signal with an other signal, and producing a demodulated output of said angularly modulated signal, which method is characterized by:
    a) reducing the required bandwidth of said filtering step below the value calculated by Carson's rule by modifying said preselected signal prior to said filtering step;
    b) reducing the bandwidth of said filtering step below the value calculated by Carson's rule;
    c) phase locking an output frequency to a reference frequency;
    d) the first said reducing step comprises converting said angularly modulated signal as a function of said phase locked output frequency; and
    e) the first said reducing step further comprises D.C. modulating said phase locked output frequency as a function of said demodulated output without varying said reference frequency.

2. A method as claimed in claim 1 in which said converting step comprises mixing said preselected signal with said phase locked output frequency prior to the first recited mixing step.

3. A method as claimed in claim 1 in which said converting step comprises changing said preselected signal to be equal to said other signal, except for a phase shift between said signals, prior to said mixing step.

4. A method as claimed in claim 1 in which said method further comprises modulating said phase locked output frequency separately from said step of D.C. modulating said phase locked output frequency.

5. A method as claimed in claim 1 in which said D.C. modulating of said phase locked output frequency comprises:
    a) producing a derived frequency that is a function of said demodulated output; and
    b) D.C. modulating said phase locked output frequency as an exact mathematical function of said derived frequency.

6. A method as claimed in claim 1 in which said method further comprises:
    a) channelizing said phase locked output frequency; and
    b) preventing interference between said channelizing and D.C. modulating steps.

7. A method as claimed in claim 1 in which:
    a) said phase locking step comprises phase locking a forward frequency and a feedback frequency to said reference frequency;
    b) said D.C. modulating of said phase locked output frequency comprises deriving a frequency from said demodulated output;
    c) said step of D.C. modulating said phase locked output frequency further comprises D.C. modulating said feedback frequency as an exact mathematical function of said derived frequency;
    d) said method further comprises modulating said forward frequency as a function of said demodulated output;
    e) said method further comprises channelizing said feedback frequency; and
    f) said method still further comprises preventing interference between said D.C. modulating and channelizing steps.

8. A method which comprises receiving an angularly modulated signal that includes modulation deviations, reducing said deviations subsequent to said receiving step, and producing a demodulated output of said angularly modulated signal subsequent to said reducing step, the improvement in which said reducing step is characterized by:
    a) phase locking an output frequency to a reference frequency;
    b) D.C. modulating said phase locked output frequency as a function of said demodulated output without varying said reference frequency; and
    c) converting said angularly modulated signal as a function of said phase locked output frequency.

9. A method as claimed in claim 8 in which:
    a) said phase locking of said output frequency comprises phase locking a forward frequency and a feedback frequency to said reference frequency;

b) said D.C. modulating of said phase locked output frequency comprises D.C. modulating said feedback frequency; and c) said method further comprises separately modulating said forward frequency as a function of said demodulated output.

10. A method as claimed in claim 8 in which:

a) said phase locking of said output frequency to said reference frequency comprises phase locking a forward frequency and a feedback frequency to said reference frequency;

b) said D.C. modulating of said phase locked output frequency comprises deriving a frequency from said demodulated output; and c) said step of D.C. modulating said phase locked output frequency further comprises D.C. modulating said feedback frequency as an exact mathematical function of said derived frequency.

11. A method as claimed in claim 8 in which:

a) said phase locking of said output frequency to said reference frequency comprises phase locking a forward frequency and a feedback frequency to said reference frequency;

b) said D.C. modulating of said phase locked output frequency comprises deriving a frequency from said demodulated output;

c) said step of D.C. modulating said phase locked output frequency further comprises D.C. modulating said feedback frequency as an exact mathematical function of said derived frequency; and d) said method further comprises modulating said forward frequency as a function of said demodulated output.

12. A method as claimed in claim 8 in which said reducing step further comprises mixing two frequencies that are equal except for a phase shift therebetween.

13. A method as claimed in claim 8 in which said method further comprises channelizing said phase locked output frequency.

14. A method as claimed in claim 8 in which:

a) said phase locking of said output frequency to said reference frequency comprises phase locking a forward frequency and a feedback frequency to said reference frequency;

b) said D.C. modulating of said phase locked output frequency comprises D.C. modulating said feedback frequency;

c) said method further comprises modulating said forward frequency;

d) said method further comprises channelizing said feedback frequency; and e) said method still further comprises preventing interference between said D.C. modulating and channelizing steps.

15. Signal processing apparatus (410) which comprises preselector means (420) for proselecting a modulated signal that includes deviations, reducing means (418 and 200, 236, 310, 330, or 390) for reducing said deviations, and processing means (416), including said reducing means, for producing a demodulated output of said modulated signal, the improvement in which said reducing means comprises:

phase locking oscillator means (270, 304, 318, 332, or 392) for supplying an output frequency to said processing means that is phase locked to a reference frequency (218 or 240); and D.C. modulator means (272, 306, 320, 334, or 394), being operatively connected (266, 268) to said demodulated output and to said phase locking oscillator means, for D.C. modulating said phase locked output frequency as a function of said demodulated output without changing said reference frequency.

16. Apparatus (410) as claimed in claim 15 in which said phase locking oscillator means (270, 304, 318, 332, or 392) comprises both a feedback path (206) and a forward path (204);

said operative connection of said D.C. modulator means (272, 306, 320, 334, or 394) to said demodulated output comprises modulator means (256) for producing a derived frequency;

said D.C. modulator means comprises means (254, 276, 322, 338, or 400) for D.C. modulating said feedback path as an exact mathematical function of said derived frequency; and said D.C. modulator means further comprises means (264) for modulating said forward path.

17. Apparatus (410) as claimed in claim 15 in which said apparatus comprises channelizing means (244) for channelizing said phase locked output frequency.

18. Apparatus (410) as claimed in claim 15 in which said phase locking oscillator means (270, 304, 318, 332, or 392) comprises both a feedback path (206) and a forward path (204);

said apparatus comprises means (264) for modulating said forward path as a function of said demodulated output; and said apparatus further comprises channelizing means (244) for channelizing said phase locked output frequency.

19. Apparatus (410) as claimed in claim 15 in which said operative connection (266 and 268) of said D.C. modulator means (272, 306, 320, 334, or 394) to said demodulated output comprises modulator means (256) for producing a derived frequency;

said D.C. modulator means comprises means (254, 276, 322, 338, or 400) for D.C. modulating said phase locked output frequency as an exact mathematical function of said derived frequency; and said apparatus comprises channelizing means (244) for channelizing said phase locked output frequency.

20. A method for processing angularly modulated signals which comprises forming a closed loop, developing a reduced frequency in said closed loop, and producing a demodulated output of said reduced frequency, the improvement which is characterized by:

a) phase locking an output frequency of a second closed loop, that includes both a forward path and a feedback path, to a reference frequency;

b) interposing said second closed loop into the first said closed loop;

c) supplying said phase locked output frequency to the first said closed loop;

d) deriving a signal from the first said closed loop;

e) D.C. modulating said feedback path of said second closed loop as a function of said derived signal without varying said reference frequency; and f) separately modulating said forward path of said second closed loop as a function of said derived signal.

21. A method as claimed in claim 20 in which said method further comprises phase locking the first said closed loop to said phase locked output frequency.

22. A method as claimed in claim 20 in which said producing step further comprises mixing two frequencies that are equal except for a phase shift therebetween.

23. A method as claimed in claim 20 in which said D.C. modulating step comprises:
  a) deriving a frequency from said derived signal; and
  b) D.C. modulating said feedback path as an exact mathematical function of said derived frequency.

24. A method as claimed in claim 20 in which said step of D.C. modulating of said feedback path comprises deriving a frequency from said derived signal, and D.C. modulating said feedback path as an exact mathematical function of said derived frequency; and
  said method further comprises channelizing said phase locked output frequency.

25. A method as claimed in claim 20 in which said method further comprises channelizing said phase locked output frequency.

26. A method as claimed in claim 20 in which said method further comprises:
  a) channelizing said phase locked output frequency; and
  b) preventing interference between said channelizing step and said modulating of said feedback path.

27. Signal processing apparatus (410) which comprises preselector means (420) for preselecting an angularly modulated signal, and means, comprising a closed loop (438), for producing a demodulated output of said angularly modulated signal, the improvement which is characterized by:
  phase locking oscillator means (270, 304, 318, 332, or 392), having an output frequency that is phase locked to a reference frequency, and being operatively interposed into said closed loop, for supplying said phase locked output frequency to said closed loop; and
  D.C. modulator means (272, 306, 320, 334, or 394), being operatively connected (266, 268) to both said phase locking oscillator means and said demodulated output, for D.C. modulating said phase locked output frequency in response to said demodulated output without changing said reference frequency.

28. Apparatus (410) as claimed in claim 27 in which said phase locking oscillator means (270, 304, 318, 332, or 392) comprises both a feedback path (206) and a forward path (204); and
  said apparatus comprises means (264) for modulating said forward path as a function of said demodulated output.

29. Apparatus (410) as claimed in claim 27 in which said operative connection of said D.C. modulator means) (272, 306, 320, 334, or 394) to said demodulated output comprises modulator means (256) for producing a derived frequency; and
  said D.C. modulator means comprises means (254, 276, 322, 338, or 400) for D.C. modulating said phase locked output frequency as an exact mathematical function of said derived frequency.

30. Apparatus (410) as claimed in claim 27 in which said apparatus comprises channelizing means (244) for channelizing said phase locked output frequency; and
  said apparatus further comprises means (246 and 276 or 322) for preventing interference between said D.C. modulator means (272, 306, 320, 334, or 394) and said channelizing means.

31. Apparatus (410) as claimed in claim 27 in which said phase locking oscillator means (270, 304, 318, 332, or 392) comprises both a feedback path (206) and a forward path (204);
  said operative connection (266 and 268) of said D.C. modulator means (272, 306, 320, 334, or 394) to said demodulated output comprises modulator means (256) for producing a derived frequency;
  said D.C. modulator means comprises means (254, 276, 322, 338, or 400) for D.C. modulating said feedback path as an exact mathematical function of said derived frequency;
  said apparatus comprises means (264) for modulating said forward path; and
  said apparatus further comprises channelizing means (244) for channelizing said phase locked output frequency.

32. Apparatus (410) as claimed in claim 27 in which said phase locking oscillator means (270, 304, 318, 332, or 392) comprises both a feedback path (206) and a forward path (204);
  said D.C. modulator means (272, 306, 320, 334, or 394) comprises means (264) for modulating both of said paths;
  said apparatus comprises channelizing means (244) for channelizing said phase locked output frequency; and
  said apparatus further comprises means (246 and 276 or 322) for preventing interference between said D.C. modulator means and said channelizing means.

33. Apparatus (410) as claimed in claim 27 in which said phase locking oscillator means (270, 304, 318, 332, or 392) comprises both a feedback path (206) and a forward path (204);
  said operative connection (266 and 268) of said D.C. modulator means (272, 306, 320, 334, or 394) to said demodulated output comprises modulator means (256) for producing a derived frequency;
  said D.C. modulator means comprises means (254, 276, 322, 338, or 400) for D.C. modulating said feedback path as an exact mathematical function of said derived frequency;
  said apparatus further comprises means (264) for modulating said forward path;
  said apparatus further comprises channelizing means (244) for channelizing said phase locked output frequency; and
  said apparatus still further comprises means (246 and 276 or 322) for preventing interference between said D.C. modulator means and said channelizing means.

34. Apparatus (410) as claimed in claim 27 in which said phase locking oscillator means (270, 304, 318, 332, or 392) comprises both a feedback path (206) and a forward path (204); and
  said D.C. modulator means (272, 306, 320, 334, or 394) comprises a dual modulus divider (234) being interposed into said feedback path.

35. Apparatus (410) as claimed in claim 27 in which said phase locking oscillator means (270, 304, 318, 332, or 392) comprises both a feedback path (206) and a forward path (204); and
  said D.C. modulator means (272, 306, 320, 334, or 394) comprises a mixer (348) being interposed into said feedback path.

36. Apparatus (410) as claimed in claim 27 in which said phase locking oscillator means (270, 304, 318, 332, or 392) comprises both a feedback path (206) and a forward path (204); and
  said D.C. modulator means (272, 306, 320, 334, or 394) comprises preventing means (312) being interposed into said feedback path, for selectively preventing pulses from flowing through said feedback path.

37. Apparatus (410) as claimed in claim 27 in which said phase locking oscillator means (270, 304, 318, 332, or 392)

comprises both a feedback path (206) and a forward path (204); and said D.C. modulator means (272, 306, 320, 334, or 394) comprises an AND gate (398) being interposed into said feedback path.

38. Apparatus (410) as claimed in claim 27 in which said phase locking oscillator means (270, 304, 318, 332, or 392) comprises both a feedback path (206) and a forward path (204); and said D.C. modulator means (272, 306, 320, 334, or 394) comprises a variable modulus divider (244) being interposed into said feedback path.

39. Apparatus (410) as claimed in claim 27 in which said apparatus comprises means, including said phase locking oscillator means (270, 304, 318, 332, or 392), and including said D.C. modulator means (272, 306, 320, 334, or 394), for making two frequencies in said apparatus equal except for a phase shift therebetween.

40. Signal processing apparatus (410), comprising a closed loop (438), for processing angularly modulated signals, the improvement which is characterized by:

phase locking oscillator means (270, 304, 318, 332, or 392), having both a forward path (204) and a feedback path (206), being interposed into said closed loop, and having an output frequency that is phase locked to a reference frequency, for supplying said phase locked output frequency to said closed loop;

means (426) for deriving a signal from said closed loop;

D.C. modulator means (272, 306, 320, 334, or 394), being operatively interposed into said closed loop, being operatively connected to said phase locking oscillator means and to said derived signal, for D.C. modulating said feedback path in response to said derived signal without changing said reference frequency; and means (264), being operatively connected to said forward path and to said derived signal, for modulating said forward path in response to said derived signal.

41. Apparatus (410) as claimed in claim 40 in which said operative connection of said D.C. modulator means (272, 306, 320, 334, or 394) to said derived signal comprises modulator means (256) for producing a derived frequency; and said D.C. modulator means comprises means (254, 276, 322, 338, or 400) for D.C. modulating said phase locked output frequency as an exact mathematical function of said derived frequency.

42. Apparatus (410) as claimed in claim 41 in which said operative connection of said D.C. modulator means (272, 306, 320, 334, or 394) to said derived signal comprises modulator means (256) for producing a derived frequency;

said D.C. modulator means comprises means (254, 276, 322, 338, or 400) for D.C. modulating said phase locked output frequency as an exact mathematical function of said derived frequency;

said apparatus comprises channelizing means (244) for channelizing said phase locked output frequency; and said apparatus further comprises means (246 and 276 or 322) for preventing interference between said D.C. modulator means and said channelizing means.

43. Apparatus (410) as claimed in claim 40 which said apparatus comprises channelizing means (244) for channelizing said phase locked output frequency.

44. Apparatus (410) as claimed in claim 40 in which said operative connection of said D.C. modulator means (272, 306, 320, 334, 394) to said derived signal comprises modulator means (256) for producing a derived frequency;

said D.C. modulator means comprises means (254, 276, 322, 338, or 400) for D.C. modulating said phase locked output frequency as an exact mathematical function of said derived frequency; and said apparatus comprises channelizing means (244) for channelizing said phase locked output frequency.

45. Apparatus (410) as claimed in claim 40 in which said apparatus comprises channelizing means (244) for channelizing said phase locked output frequency; and said apparatus further comprises means (246 and 276 or 322) for preventing interference between said D.C. modulator means (272, 306, 320, 334, 394) and said channelizing means.

46. Apparatus (410) as claimed in claim 40 in which said apparatus comprises means, including both said phase locking oscillator means (270, 304, 318, 332, or 392) and said D.C. modulator means (272, 306, 320, 334, or 394), for phase locking said closed loop to said phase locked output frequency.

* * * * *

UNITED STATES PATENT AND TRADEMARK OFFICE
CERTIFICATE OF CORRECTION

PATENT NO. : 5,497,502
DATED : 5 March 1996
INVENTOR(S) : Lloyd L. Lautzenhiser

It is certified that error appears in the above-indentified patent and that said Letters Patent is hereby corrected as shown below:

Column 1, "5,091,706" should be --5,091,701-- in line 6. In column 7, "or" should be --of-- in lines 39 and 60. In column 8, "arid" should be --and-- in line 31. In column 13, "part" should be --parts-- in line 58. In column 20, "284" should be --234-- in line 37. In column 27, ""0" → "1"" should be --"1" → "1"-- in line 42. In column 32, "Lite" should be --the-- in line 44. In Claim 15, "proselecting" should be --preselecting-- in line 56. In Claim 29, "means)" should be --means-- in line 44. In Claim 43, "which" should be --in which-- in line 16.

Signed and Sealed this

Twenty-second Day of April, 1997

Attest:

BRUCE LEHMAN

*Attesting Officer*

*Commissioner of Patents and Trademarks*